(12) United States Patent
Sugahara

(10) Patent No.: US 7,266,868 B2
(45) Date of Patent: Sep. 11, 2007

(54) METHOD OF MANUFACTURING LIQUID DELIVERY APPARATUS

(75) Inventor: Hiroto Sugahara, Miwa-cho (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 239 days.

(21) Appl. No.: 10/876,706

(22) Filed: Jun. 28, 2004

(65) Prior Publication Data

US 2004/0263582 A1  Dec. 30, 2004

(30) Foreign Application Priority Data

Jun. 30, 2003  (JP) ............... 2003-187729
Sep. 26, 2003  (JP) ............... 2003-335166

(51) Int. Cl.
*H04R 17/00* (2006.01)
*B21D 53/76* (2006.01)

(52) U.S. Cl. ............ 29/25.35; 29/890.1; 29/412; 347/71; 347/72; 310/328; 310/331

(58) Field of Classification Search ........... 29/25.35, 29/890.1, 412, 417; 347/68, 71, 72; 310/312, 310/321, 328, 330, 331
See application file for complete search history.

(56) References Cited

U.S. PATENT DOCUMENTS

| | | | |
|---|---|---|---|
| 5,126,615 A * | 6/1992 | Takeuchi et al. ......... | 310/330 |
| 5,512,793 A | 4/1996 | Takeuchi et al. | |
| 5,963,234 A | 10/1999 | Miyazawa et al. | |
| 6,198,203 B1 | 3/2001 | Hotomi | |
| 2002/0175975 A1 | 11/2002 | Mitsuhashi et al. | |
| 2003/0081079 A1 | 5/2003 | Mitsuhashi et al. | |
| 2003/0103116 A1 | 6/2003 | Sugahara et al. | |
| 2004/0104977 A1 | 6/2004 | Mitsuhashi et al. | |
| 2005/0030351 A1 | 2/2005 | Sugahara et al. | |

FOREIGN PATENT DOCUMENTS

DE  3445761 A1  6/1985

(Continued)

OTHER PUBLICATIONS

Fuda et al., "Ceramic Actuator with Three-Dimensional Electrode Structure", Proceedings of the Eighth IEEE Symposium on Applications of Ferroelectrics, 1992, pp. 573-576, May 1992.*

*Primary Examiner*—A. Dexter Tugbang
(74) *Attorney, Agent, or Firm*—Oliff & Berridge, PLC

(57) ABSTRACT

A method of manufacturing a liquid delivery apparatus comprising: a plurality of pressure chambers accommodating a liquid; nozzles communicating with the respective chambers; and a plurality of piezoelectric ceramic sheets disposed at respective positions corresponding to the chambers, the apparatus being configured to deliver the liquid to the outside from selected one of the nozzles by deforming the corresponding ceramic sheet to pressurize the liquid in the corresponding chamber, the method comprising steps of: providing a fluid-passage-unit forming member which forms at least a part of a fluid passage unit; laminating a green sheet to be eventually formed into the ceramic sheets on a jig substrate; segmenting the green sheet into a plurality of segments; firing the segments obtained by the segmenting step into the ceramic sheets; and fixing at least predetermined ones of the ceramic sheets acquired by the firing step to the fluid-passage-unit forming member.

27 Claims, 24 Drawing Sheets

FOREIGN PATENT DOCUMENTS

| | | | |
|---|---|---|---|
| EP | 0 759 361 A2 | 2/1997 | |
| JP | A-58-218145 | 12/1983 | |
| JP | A 60-151062 | 8/1985 | |
| JP | A 5-309841 | 11/1993 | |
| JP | 5-335821 | * 12/1993 | ................ 26/25.35 |
| JP | A-07-214779 | 8/1995 | |
| JP | A 9-131866 | 5/1997 | |
| JP | A-9-277523 | 10/1997 | |
| JP | A 9-314836 | 12/1997 | |
| JP | A-2000-117992 | 4/2000 | |
| JP | A-2002-158653 | 6/2000 | |
| JP | A 2001-247376 | 9/2001 | |
| JP | A-2002-234169 | 8/2002 | |
| JP | A-2002-374012 | 12/2002 | |
| JP | A-2003-48323 | 2/2003 | |
| JP | A-2003-165216 | 6/2003 | |

* cited by examiner

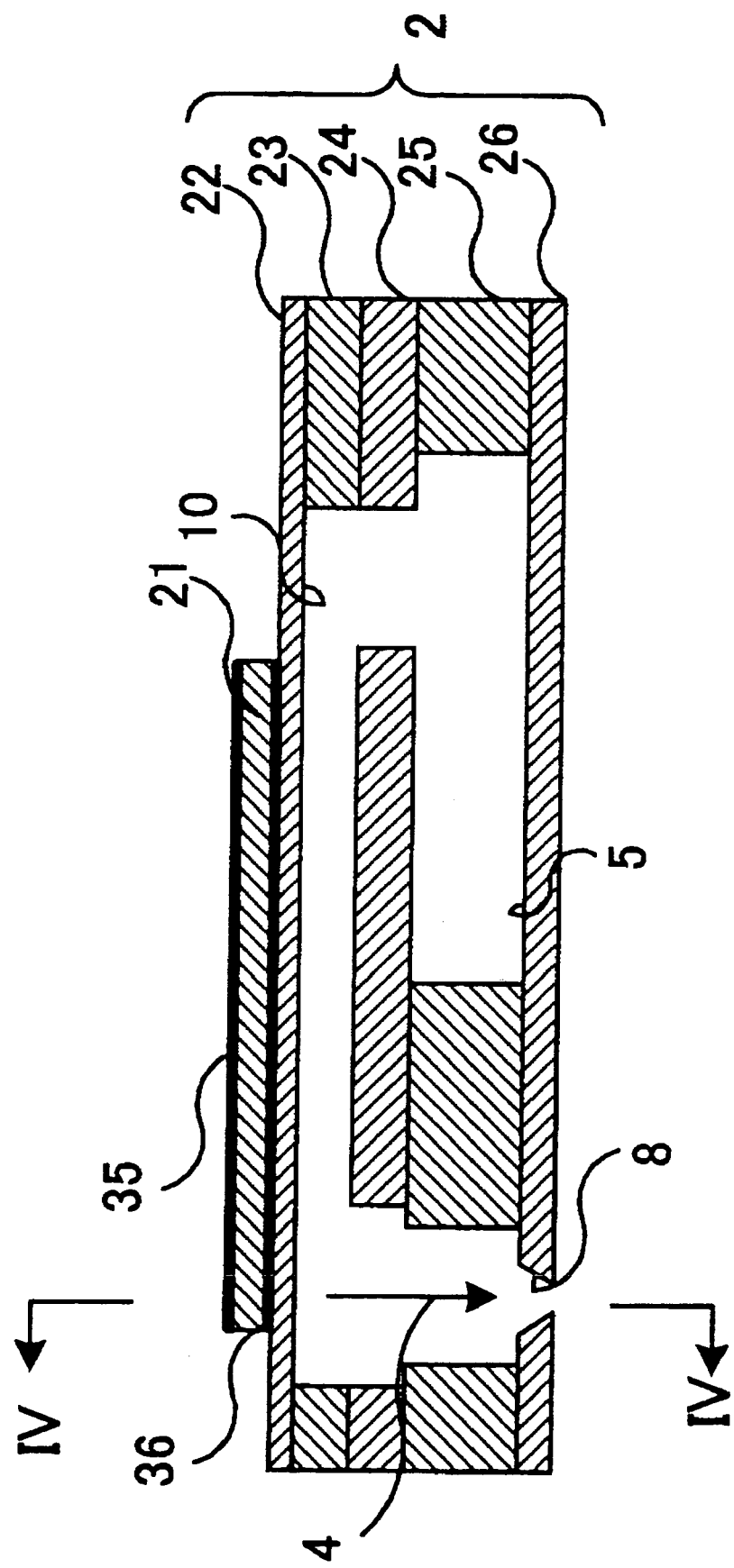

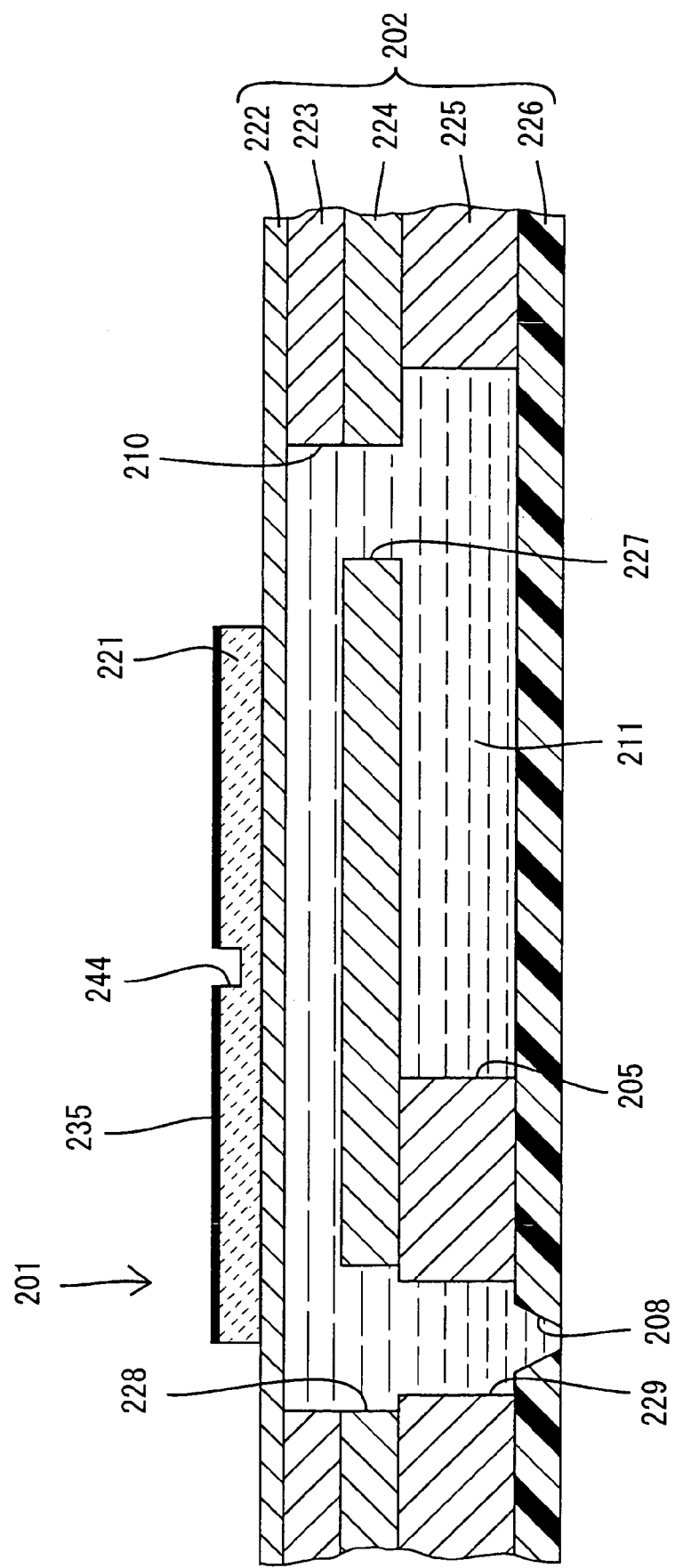

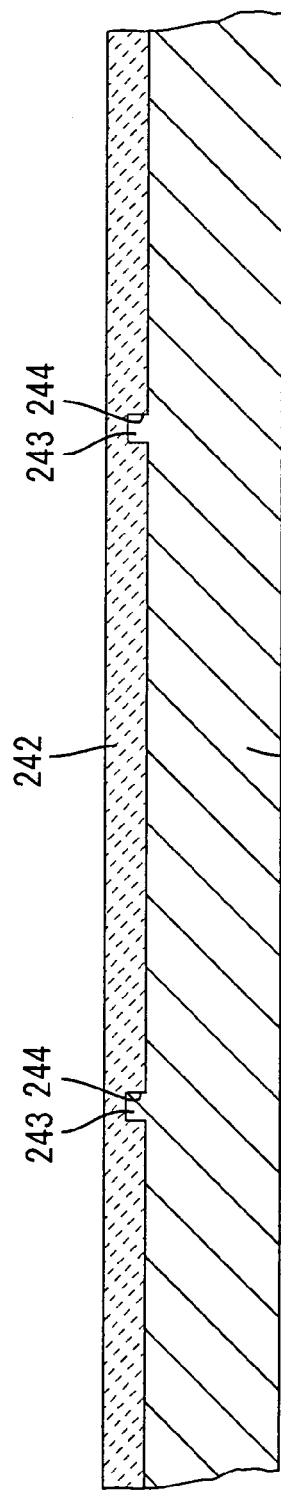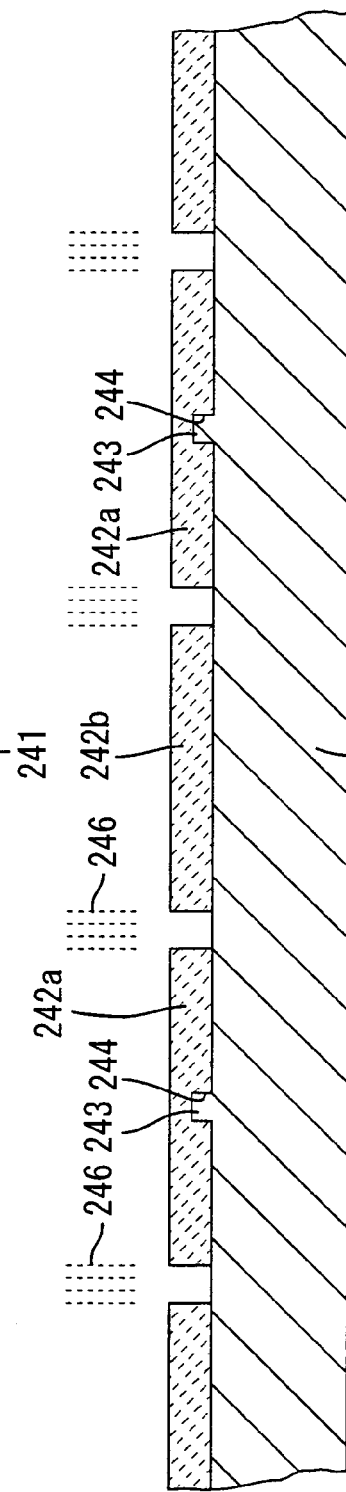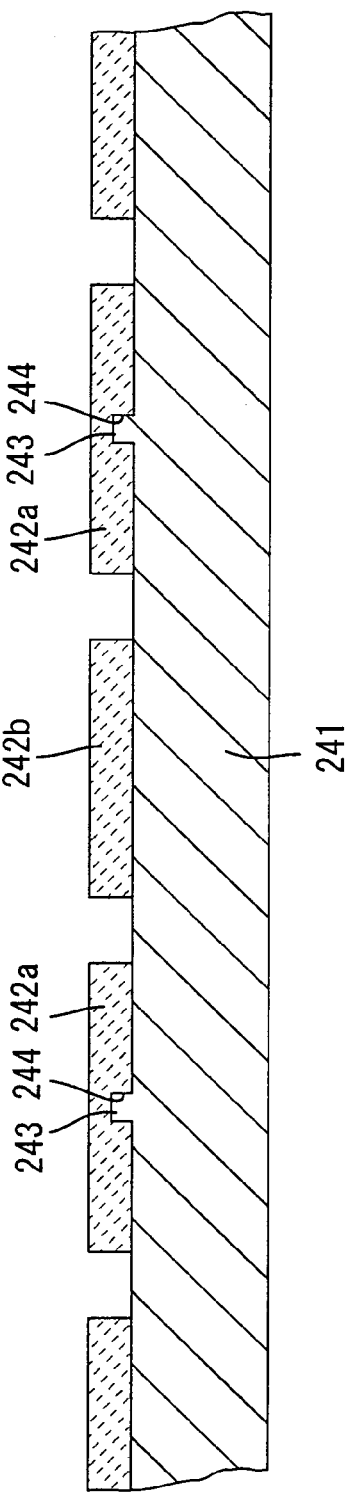

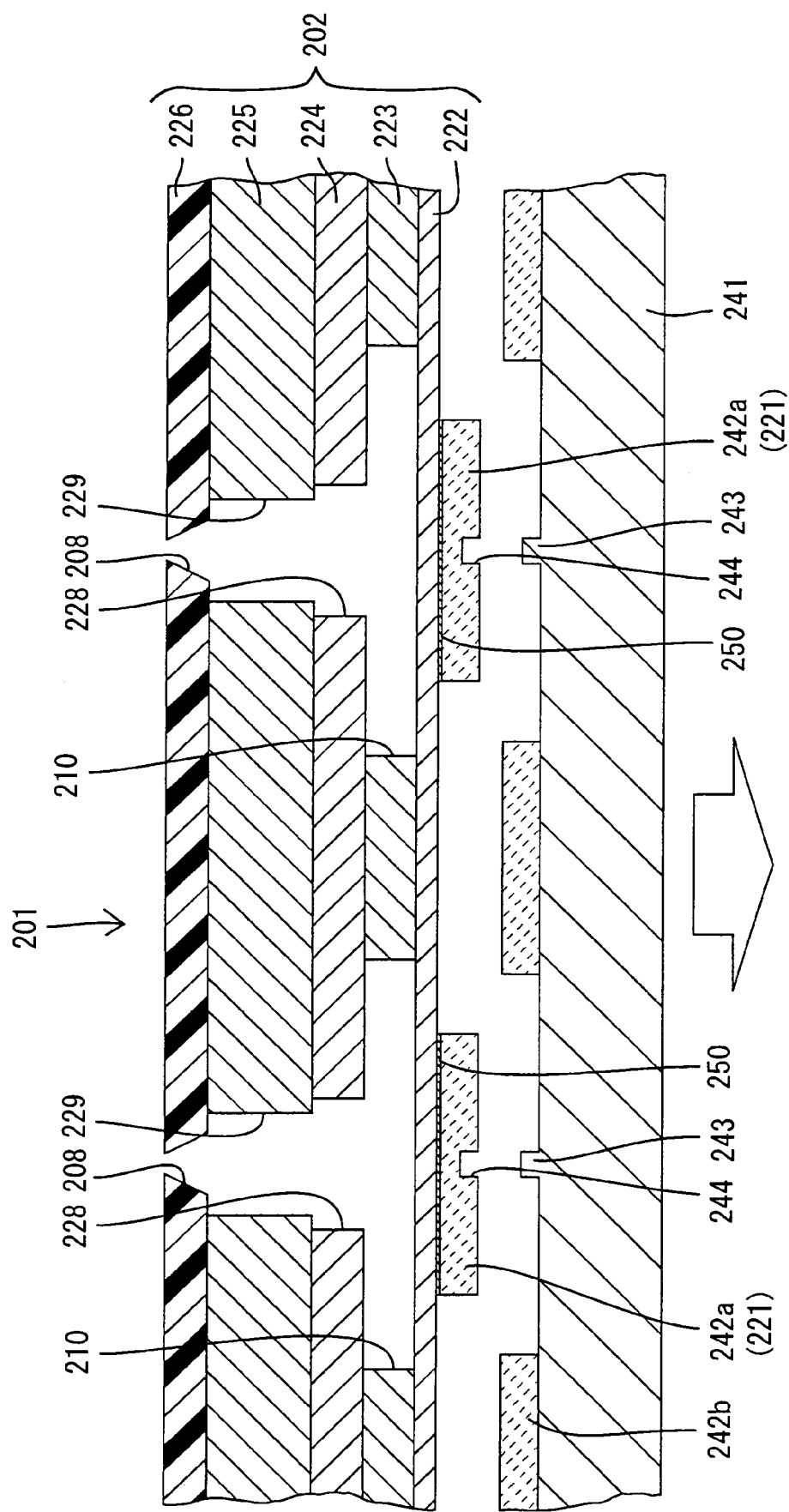

242b  221  265 264  241
     (242a)

242b  221  267 266  241
     (242a)

METHOD OF MANUFACTURING LIQUID DELIVERY APPARATUS

The present application is based on Japanese Patent Applications Nos. 2003-187729 and 2003-335166, filed on Jun. 30, 2003 and Sep. 26, 2003, respectively, the contents of which are incorporated herein by reference.

BACKGROUND OF THE INVENTION

1. Field of the Invention

The present invention generally relates to a method of manufacturing a liquid delivery apparatus, and particularly to a method of manufacturing a liquid delivery apparatus using a piezoelectric ceramic material.

2. Discussion of Related Art

There is known as a kind of liquid delivery apparatus used as an ink jet head, an apparatus using a piezoelectric element for pressurizing an ink to eject a droplet of the ink from a nozzle, which apparatus is advantageous, for instance, in that: it is possible to eject a liquid which is not of water type; it is possible to accurately control volume of the droplet of the ink as ejected, thereby enabling to control an area covered by a droplet of the ink in gradation sequence; and the ink jet head exhibits a high durability. JP-A-9-314836 or its corresponding U.S. Pat. No. 5,963,234 discloses such a kind of apparatus used as an ink jet head, comprising: a plurality of pressure chambers each accommodating an ink; and an actuator plate comprising a plurality of piezoelectric ceramic sheets and a diaphragm on which are bonded the piezoelectric ceramic sheets at respective positions corresponding to the pressure chambers, the actuator plate being disposed such that the actuator plate closes the plurality of pressure chambers. Upon application of an electric field on one of piezoelectric ceramic sheets as desired, the actuator plate is locally deflected at the position corresponding to the actuated piezoelectric ceramic sheet, thereby pressurizing the ink in the relevant pressure chamber and ejecting the ink from an opening communicated with the pressure chamber.

To manufacture such a liquid delivery apparatus, there is involved a step of bonding multiple piezoelectric ceramic sheets to a fluid passage unit where multiple pressure chambers and openings each communicating with one of the pressure chambers are formed. The piezoelectric ceramic sheets are obtained by first firing a green sheet of a ceramic material into a large piezoelectric ceramic sheet and then segmenting the piezoelectric ceramic sheet into a plurality of segments by using a diamond cutter or the like.

However, the step of segmenting the piezoelectric ceramic sheet with the diamond cutter or the like inevitably includes a substep which is cumbersome and takes a relatively long time to implement, for instance, spraying a coolant or lubricant, and cleansing relevant members for eliminating chips generated during the piezoelectric ceramic sheet is segmented. Further, since the piezoelectric ceramic sheet as has been fired has a high mechanical strength, the segmenting step requires a large machine such as the diamond cutter. This leads to lowering the yield of the piezoelectric ceramic sheets, pushing up the manufacturing cost of the liquid delivery apparatus. In addition, according to the above-described conventional method, it is essential to position with high accuracy the multiple piezoelectric ceramic sheets on the diaphragm with respect to the multiple pressure chambers.

SUMMARY OF THE INVENTION

In view of the above-described situations, an object of the present invention is to provide a method of manufacturing a liquid delivery apparatus, which does not require a step which is cumbersome and takes a relatively long time to implement, and which is capable of assuring high accuracy in positioning the piezoelectric ceramic sheets.

To attain the object, the invention provides a method of manufacturing a liquid delivery apparatus which comprises: a plurality of pressure chambers accommodating a liquid; nozzles communicating with the respective pressure chambers; and a plurality of piezoelectric ceramic sheets disposed at respective positions corresponding to the pressure chambers, the apparatus being configured to deliver the liquid to the outside from selected one of the nozzles by deforming the corresponding piezoelectric ceramic sheet to pressurize the liquid in the corresponding pressure chamber, the method comprising steps of: providing a fluid-passage-unit forming member which forms at least a part of a fluid passage unit; laminating a green sheet to be eventually formed into the plurality of piezoelectric ceramic sheets on a jig substrate; segmenting the green sheet into a plurality of segments; firing the plurality of segments of the green sheet obtained by the segmenting step into the plurality of piezoelectric ceramic sheets; and fixing at least predetermined ones of the plurality of piezoelectric ceramic sheets acquired by the firing step to the fluid-passage-unit forming member.

According to the above-described method, the green sheet is segmented before it is fired. This is advantageous over the arrangement where the piezoelectric ceramic sheet as has been obtained by firing the green sheet is segmented, in that the segmenting step is simplified and requires a relatively short time to be implemented. Further, the yield of the piezoelectric ceramic sheets is improved, lowering the manufacturing cost of the liquid delivery apparatus. Still further, since the piezoelectric ceramic sheets formed on the jig substrate are fixed on the fluid-passage-unit forming member while being integral with the jig substrate, the piezoelectric ceramic sheets can be disposed at respective nominal positions with high accuracy.

A first preferred mode of the above-described method is such that the step of providing the fluid-passage-unit forming member comprises forming a fluid-passage-unit forming member having the plurality of pressure chambers and the nozzles, and the fixing step comprises fixing the at least predetermined ones of the plurality of piezoelectric ceramic sheets to the fluid-passage-unit forming member.

The fluid-passage-unit forming member may not include a diaphragm or top plate; where the fluid-passage-unit forming member does not include a diaphragm or top plate, the plurality of piezoelectric ceramic sheets integral with a diaphragm or top plate may be fixed to the fluid-passage-unit forming member.

A second preferred mode of the above-described method is such that: the jig substrate has a plurality of positioning portions which are disposed at least one for each of positions corresponding to the plurality of pressure chambers; the laminating step comprises forming the green sheet on the jig substrate having the plurality of positioning portions; and the fixing step comprises fixing, to the fluid-passage-unit forming member, the at least predetermined piezoelectric ceramic sheets that are positioned on the jig substrate by means of the positioning portions.

According to the second preferred mode where the jig substrate has the positioning portions, the displacement of the piezoelectric ceramic sheets occurring while the piezoelectric ceramic sheets are fired is prevented. Thus, the positional accuracy of each piezoelectric ceramic sheet when fixed to the diaphragm is enhanced.

One form of the method according to the second preferred mode may be such that the fluid-passage-unit forming member has a diaphragm which closes the plurality of pressure chambers, and the fixing step comprises fixing to the diaphragm the at least predetermined piezoelectric ceramic sheets that are positioned on the jig substrate by means of the positioning portions.

According to this arrangement where the green sheet is segmented before it is fired, the segmenting step is simplified and requires a relatively short time to be implemented, in comparison with the case where the piezoelectric ceramic sheet as obtained by firing the green sheet is segmented. Further, the yield of the piezoelectric ceramic sheets is improved, lowering the manufacturing cost of the liquid delivery apparatus. Still further, the arrangement where the piezoelectric ceramic sheets formed on the jig substrate is fixed on the fluid-passage-unit forming member while being integral with the jig substrate, the piezoelectric ceramic sheets are disposed at respective nominal positions with high accuracy. In addition, since the fluid-passage-unit forming member has the diaphragm, the "unimorph deformation" utilizing the piezoelectric ceramic sheet is enabled, enhancing the efficiency in delivering the liquid droplets.

A third preferred mode of the method is such that the fixing step comprises fixing the at least predetermined piezoelectric ceramic sheets that are positionally corresponding to the plurality of pressure chambers to the fluid-passage-unit forming member so as to oppose the plurality of pressure chambers, respectively.

According to the third preferred mode, the liquid droplet delivery characteristics of the apparatus is enhanced.

A fourth preferred mode of the method is such that the fluid-passage-unit forming member has a diaphragm which closes the plurality of pressure chambers; and the fixing step comprises fixing the at least predetermined ones of the plurality of piezoelectric ceramic sheets acquired by the firing step, to the diaphragm.

According to the fourth preferred mode, the same advantages as the above-described one form of the second preferred mode can be obtained.

BRIEF DESCRIPTION OF THE DRAWINGS

The above and other objects, features, advantages and technical and industrial significance of the present invention will be better understood by reading the following detailed description of preferred embodiments of the invention, when considered in connection with the accompanying drawings, in which:

FIG. 2A is a plan view of an ink ejecting surface of a main body of the head of FIG. 1, while

FIG. 3 shows a cross section taken along a line III-III in FIG. 2B;

FIG. 13 shows a cross section taken along a line extending in a longitudinal direction of a pressure chamber of an ink jet head as manufactured according to a method of sixth embodiment of the invention;

FIG. 16A is a cross sectional view showing a state where a green sheet is formed on a jig substrate; FIG. 16B is a cross sectional view showing a state where the green sheet is segmented with a laser beam; and FIG. 16C is a cross sectional view showing a state after the green sheet has been fired.

FIG. 19 shows a cross section showing a state where the piezoelectric ceramic sheets are separated from the jig substrate;

FIG. 23A shows a cross section showing a step of forming piezoelectric ceramic sheets in a method of manufacturing an ink jet head according to an eighth embodiment, while FIG. 24A shows a cross section showing a step of forming piezoelectric ceramic sheets in a method of manufacturing an ink jet head according to a ninth embodiment, while

DETAILED DESCRIPTION OF THE PREFERRED EMBODIMENTS

There will be described presently preferred several embodiments of the invention, by reference to the accompanying drawings.

First Embodiment

Figure 1:
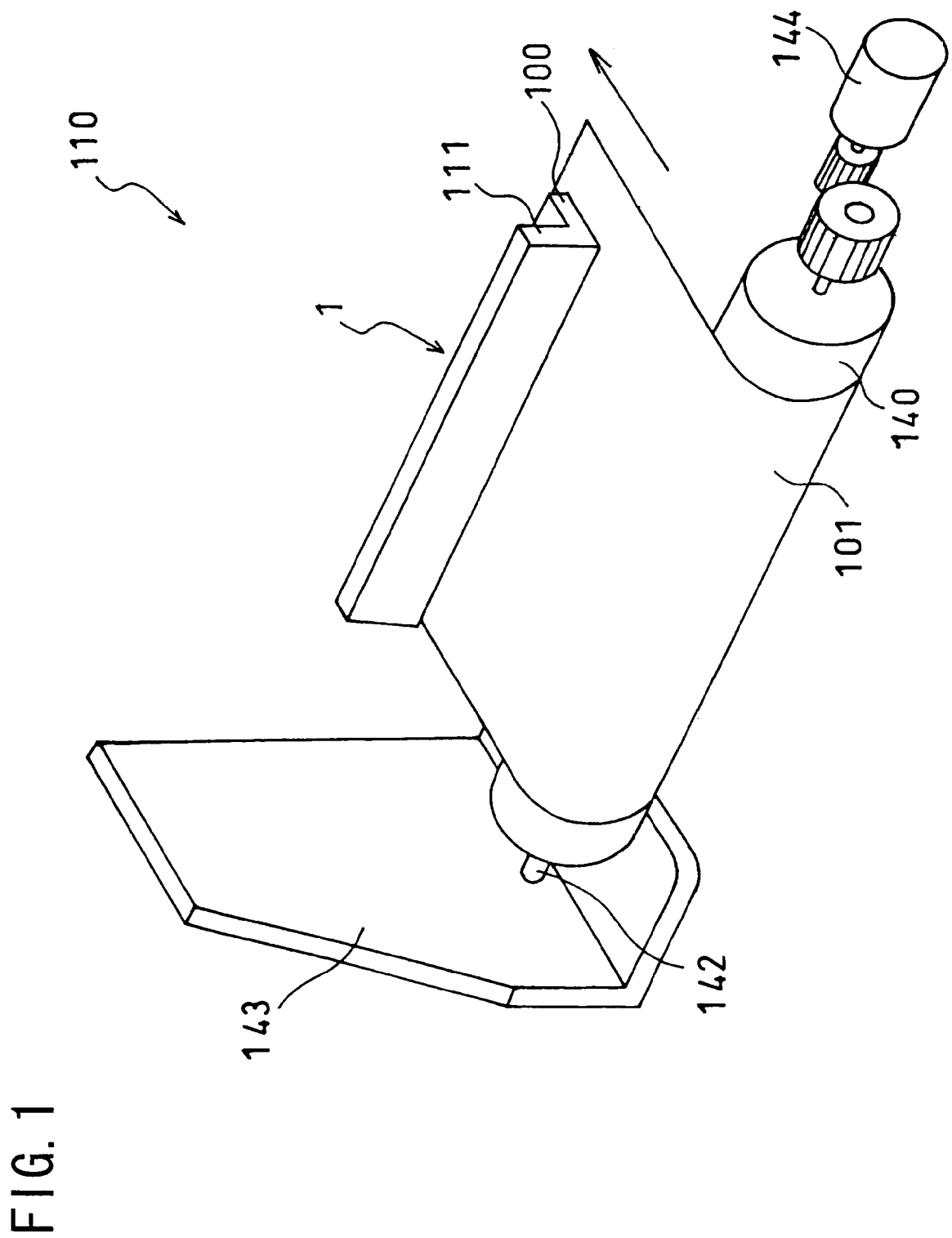
FIG. 1 is a schematic perspective view of an ink jet printer including an ink jet head as manufactured according to a method of a first embodiment of the invention.

FIG. 1 is a perspective view schematically showing an ink jet printer 110 including an ink jet head 1 as manufactured according to a method of a first embodiment of the invention. The ink jet printer 110 includes a platen roller 140 also, which serves as a sheet feeder for conveying a printing medium in the form of a sheet of paper 101. The ink jet head 1 ejects an ink droplet onto the sheet 101 as fed by the platen roller 140.

The platen roller 140 is mounted on a shaft 142 which is attached to a frame 143. The shaft 142 is driven by a motor 144 so as to rotate the platen roller 140. The sheet 101 is supplied from a feeder cassette (not shown) disposed on one side portion of the ink jet printer 110, and is fed by the platen roller 140 in a direction as indicated by an arrow shown in FIG. 1, at a constant speed, while printing is performed or a desired image is formed on the sheet 101 with ink droplets ejected from the ink jet head 1. The sheet 101 is then discharged or ejected. Detailed illustration of mechanisms for supplying and ejecting the sheet 101 is not provided in FIG. 1. Although the ink jet printer 110 shown in FIG. 1 is a monochrome printer and has a single ink jet head 1, in a case where color printing is desired, at least four ink jet heads 1 for respective inks of different colors, including yellow (Y), magenta (M), cyan (C) and black (K), are disposed in a row.

The ink jet head 1 operates to eject an ink droplet onto the sheet 101 and comprises a main body 100 and a base portion 111. The main body 100 extends in a direction, while the base portion 111 vertically extends from a width end of the main body 100 to support the main body 100.

As shown in FIG. 2, the main body 100 has an ink ejecting surface 102 in which multiple nozzles 8 are formed in a row extending in a longitudinal direction of the main body 100. The ink ejecting surface 102 is to be opposed to and in parallel with a surface of the sheet 101 as being fed by the platen roller 140. Thus, an ink droplet discharged from each nozzle 8 formed in the ink ejecting surface 102 of the main body 100 is ejected onto the sheet 101.

Figure 2A:
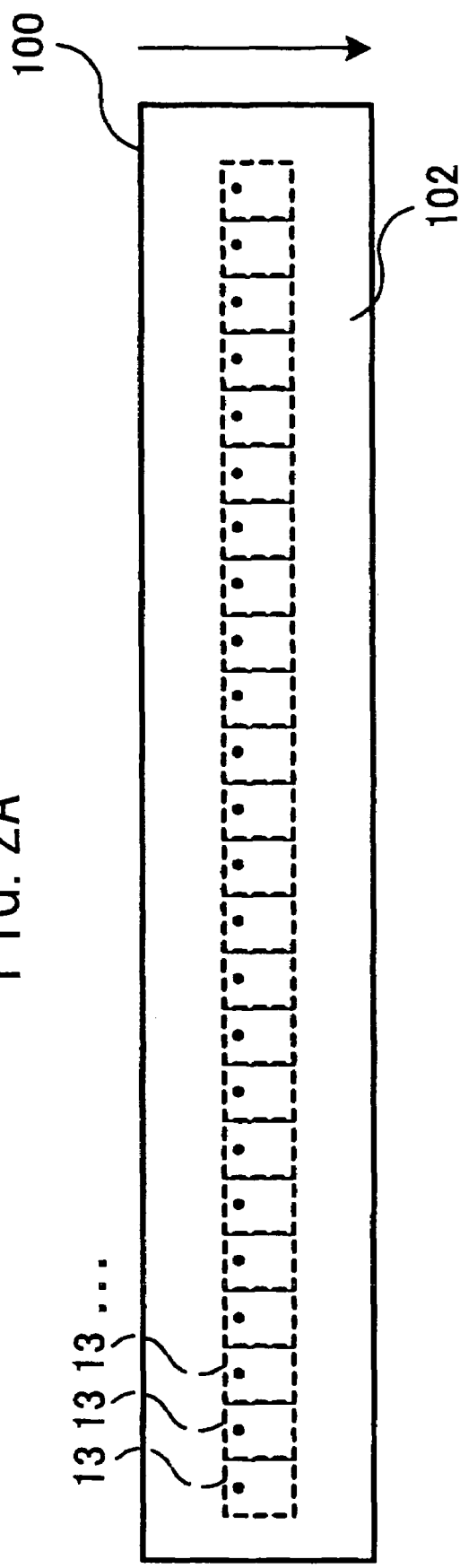

There will be now described the structure of the main body 100 in detail. FIG. 2A is a plan view of the main body 100 as seen from the side of the ink ejecting surface 102, in which the direction of feeding the sheet 101 is indicated by an arrow. As shown in FIG. 2A, ejecting units 13 (as indicated by broken lines) are disposed in a row in the ink ejecting surface 102 of the main body 100. The row of the ejecting units 13 extends along a direction perpendicular to the direction of feeding the sheet 101. Each ejecting unit 13 has a single nozzle 8, as shown in FIG. 2B which is an enlarged view of one of the ejecting units 13 shown in FIG. 2A.

Figure 2B:
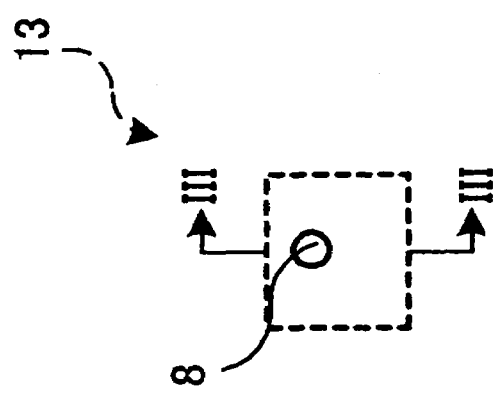
FIG. 2B shows one of ejecting units thereof in enlargement.

FIG. 3 is a cross sectional view of the main body 100 as taken along a line III-III in FIG. 2B. As shown in FIG. 3, the main body 100 includes a fluid passage unit 2 wherein multiple pressure chambers 10 each in communication with one of the nozzles 8, a lower electrode 36 formed above, or at a position corresponding to, each of the pressure chambers 10, a piezoelectric ceramic sheet 21 disposed on the lower electrode 36, and an upper electrode 35 formed on the piezoelectric ceramic sheet 21. Each nozzle 8 is communicated with a common ink chamber 5 via the corresponding pressure chamber 10. Thus, the main body 100 has an individual ink passage 4 for each of the pressure chamber 10, each of which originates from an outlet of the common ink chamber 5 and terminates at the each nozzle 8 through the corresponding pressure chamber 10.

The fluid passage unit 2 is formed by laminating a top plate 22, a cavity plate 23, a supply plate 24, a manifold plate 25 and a nozzle plate 26, in the order of the description, from top down. Each of the plates 22-26 is a metallic plate. The top plate 22 has no hole formed therethrough, and is grounded at a position not shown so as to be held at a ground potential. The lower electrode 36 is also held at a ground potential accordingly. As will be described later, the top plate 22 functions as a diaphragm which deflects toward the pressure chamber 10 in accordance with a deformation of the piezoelectric ceramic sheet 21.

In the cavity plate 23 are formed multiple through-holes each of which is to partially define one of the pressure chambers 10. In the supply plate 24 are formed through-holes to respectively define communication holes for communication between the pressure chambers 10 and the common ink chamber 5 and between the pressure chambers 10 and the corresponding nozzles 8. In the manifold plate 25 are formed a through-hole to partially define the common ink chamber 5 and through-holes to function as communication holes for communication between the pressure chambers 10 and the corresponding nozzles 8. In the nozzle plate 26 are formed the nozzles 8 corresponding to respective pressure chambers 10 formed in the cavity plate 23. These five plates 22-26 are laminated with being properly positioned with respect to each other.

The lower electrode 36 is provided by an adhesive. Each the piezoelectric ceramic sheet 21 is formed of a ceramic material of lead (Pb)-zirconate-titanate (PZT) having a ferroelectric property. The piezoelectric ceramic sheet 21 is polarized in a direction of the thickness of the piezoelectric ceramic sheet 21. The upper electrode 35 is formed of an electrically conductive material such as an Ag—Pd alloy, and connected to a driver IC (not shown) through a signal line (not shown), while the lower electrode 36 is held at the ground potential, as described above. Therefore, by bringing the level of the potential of the upper electrode 35 higher than the ground potential, an electric field is applied onto the piezoelectric ceramic sheet 21 in the direction of the polarization. The piezoelectric ceramic sheet 21, serving as an active layer on which the electric field is applied, contracts in a direction perpendicular to the polarization by transversal piezoelectric effect. On the other hand, the top plate 22 does not spontaneously contract since the top plate 22 is not affected by the electric field. Hence, there arises a difference between distortions of the piezoelectric ceramic sheet 21 and the top plate 22 (positioned below the sheet 21) in the direction perpendicular to the polarization. In addition to this, since the top plate 22 is adhered to the cavity plate 23, the piezoelectric ceramic sheet 21 and the top plate 22 are induced to together deflect toward the pressure chamber 10, that is, there takes place "unimorph deformation". Thus, the inner volume of the pressure chamber 10 is reduced, pressurizing the ink accommodated therein, which causes the ink to be ejected from the nozzle 8. The potential of the upper electrode 35 is then restored to the same level as that of the lower electrode 36, which in turn restores the shapes of the piezoelectric ceramic sheet 21 and top plate 22 to their original shapes and accordingly the inner volume of the pressure chamber 10 to its original volume. This allows the pressure chamber 10 to suck in the ink from the common ink chamber 5.

A driving method other than that described above may be employed, that is: Potentials of the upper and lower electrodes 35, 36 are held different in the non-driven state of the piezoelectric ceramic sheet 21; each time ink ejection is required, the potentials of the upper and lower electrodes 35, 36 are once made equal, and subsequently the potentials of the upper and lower electrodes 35, 36 are differentiated or restored to their respective previous levels at a predetermined timing. In this case, when the potentials of the piezoelectric ceramic sheet 21 and top plate 22 are made the same, the shapes of the sheet 21 and top plate 22 are restored to their original shapes, thereby increasing the inner volume of the pressure chamber 10 in comparison with the initial state (i.e., in the state where the potentials of the two electrodes 35, 36 are different), which make the ink in the common ink chamber 5 be sucked into the pressure chamber 10. When the potential of the upper electrode 35 is subsequently differentiated from that of the lower electrode 36 again, the piezoelectric ceramic sheet 21 and top plate 22 are deflected toward the pressure chamber 10, reducing the inner volume of the pressure chamber 10 and accordingly pressurizing the ink in the pressure chamber 10, letting the ink be ejected from the nozzle 8.

In the main body 100 according to the present embodiment, the top plate 22 as a diaphragm is included in the fluid passage unit 2, as described above. This arrangement enhances efficiency in the ink ejection, owing to the unimorph deformation.

There will next be described a method of manufacturing the main body 100 of the ink jet head 1 as described above, by reference to FIGS. 4 and 5.

Figure 4A:
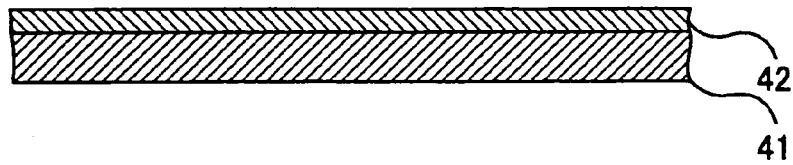
FIGS. 4A-4E are cross sectional views illustrating the method of the first embodiment in the order of steps.

Initially, a green sheet 42 made of a piezoelectric ceramic material is formed to have a uniform thickness on a jig substrate 41 made of a ceramic material (FIG. 4A). The green sheet 42 has a surface area substantially the same as that of the top plate 22. The green sheet 42 is formed such that the green sheet 42 is simply placed on and separatable from the jig substrate 41.

Figure 4B:
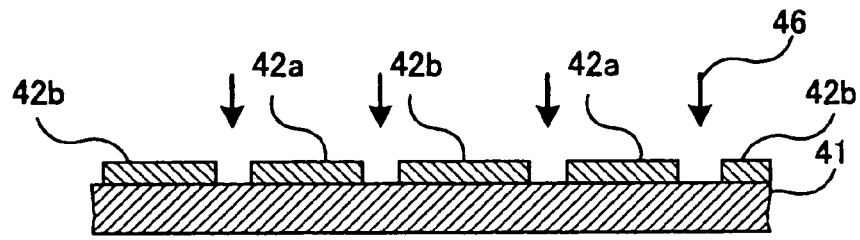

Subsequently, a laser beam 46 is emitted from a YAG laser light source (not shown) toward the green sheet 42 so as to segment the green sheet 42 into a plurality of first segments 42a and at least one second segment 42b (FIG. 4B). It is noted that the green sheet 42 is segmented as if a plurality of first segments 42a are punched out from the green sheet 42, leaving a single unsevered member to be peeled off as a second segment 42b. Alternatively, the green sheet 42 may be segmented into a plurality of first segments and a plurality of second segments. Each of the first segments 42a has a planar shape substantially the same as that of the pressure chamber 10 and has a surface area slightly smaller than that of the pressure chamber 10; for instance, each pressure chamber 10 has an oblong rectangular shape with rounded corners as seen from the upper side, while each first segment 42a or piezoelectric ceramic sheet also has a similar oblong rectangular shape with rounded corners, but one size smaller than that of the pressure chamber 10. A distance or width of a groove between each of the first segments 42a and each of the at lest one second segment 42b adjacent thereto is constant.

Figure 4C:
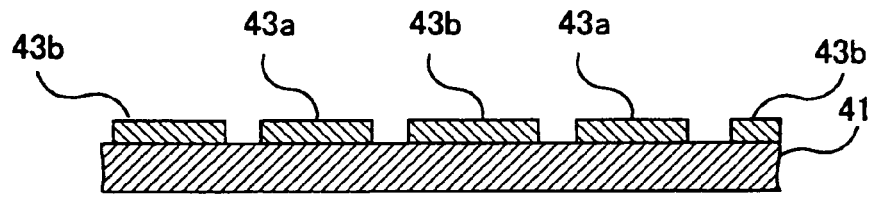

Then, the green sheet 42 (i.e., first and second segments 42a, 42b) is fired into a piezoelectric ceramic sheet (fired first segments 43a and fired at least one second segment 43b) (FIG. 4C).

Figure 4D:
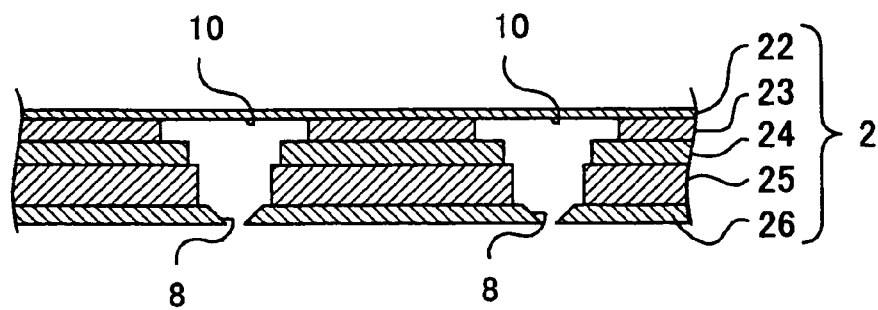

Meanwhile, the fluid passage unit 2 is formed by bonding to one another the top plate 22, cavity plate 23, supply plate 24, manifold plate 25 and nozzle plate 26, which are superposed in the order of the description with being relatively positioned appropriately (FIG. 4D). In this regard, there are formed in advance, in the relevant metallic plates 22-26, the through-holes to function as the pressure chambers 10, nozzles 8, the common ink chamber 5 and others, by etching or other methods. FIGS. 4D, 4E, 5A and 5B show cross sections each taken along a line IV-IV in FIG. 3.

Figure 4E:
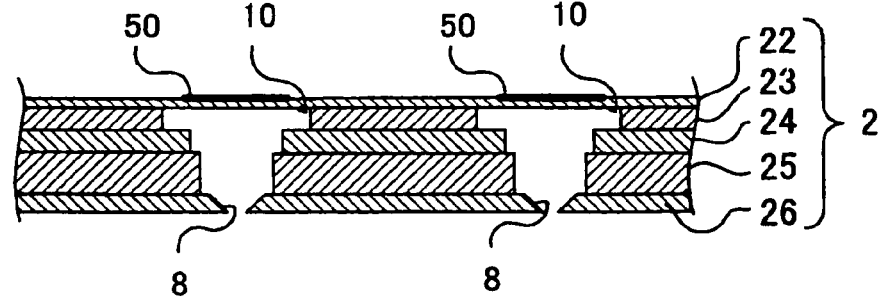

Then, an adhesive 50 is applied on the top plate 22 of the fluid passage unit 2 at a position corresponding to the pressure chamber 10 (FIG. 4E). The way of applying the adhesive 50 is as follows: Initially, a planar member (not shown) is coated with the adhesive 50 with a uniform thickness over the entire surface of the planar member, such that a surface area of the applied adhesive can encompass surfaces of all pressure chambers 10 partially defined by the top plate 22; subsequently, a mold having recesses (each having a shape conforming to the shape of the fired first segment 43a) arranged in a pattern the same as the pattern of disposing the pressure chambers 10 is pressed onto the planar member coated with the adhesive 50, to partially eliminate the adhesive 50 from the planar member; and then pieces of the adhesive 50 remaining on the planar member in the pattern the same as the arrangement of the pressure chambers 10 and each having the same shape as the fired first segment 43a, are transferred onto the top plate 22 at respective positions corresponding to the pressure chambers 10. Thus transferred adhesive 50 or pieces thereof functions as the lower electrode 36 as a product.

Figure 5A:
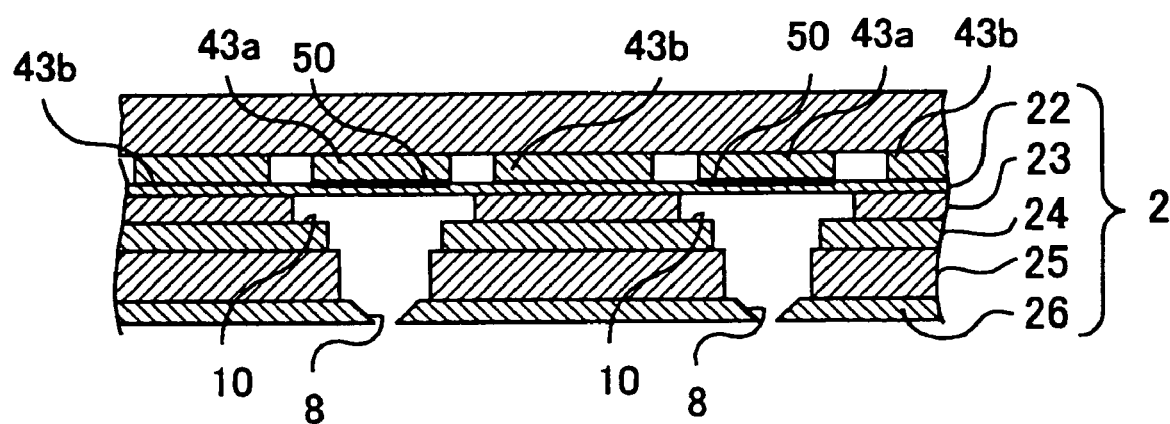
FIGS. 5A and 5B are cross sectional views illustrating subsequent steps of the method.

Then, the jig substrate 41 and the top plate 22 are positioned such that the fired first segments 43a of the piezoelectric ceramic sheet and the pressure chambers 10 are disposed in the opposed relationship with respect to their relative position, and in this state the first and fired second segments 43a, 43b are brought into contact with the top plate 22. Since the top plate 22 is coated with the adhesive at the positions corresponding to the pressure chambers 10, the fired first segments 43a are bonded to the top plate 22 with the adhesive 50, while the at least one fired second segment 43b is not bonded to the top plate 22 (FIG. 5A).

Figure 5B:
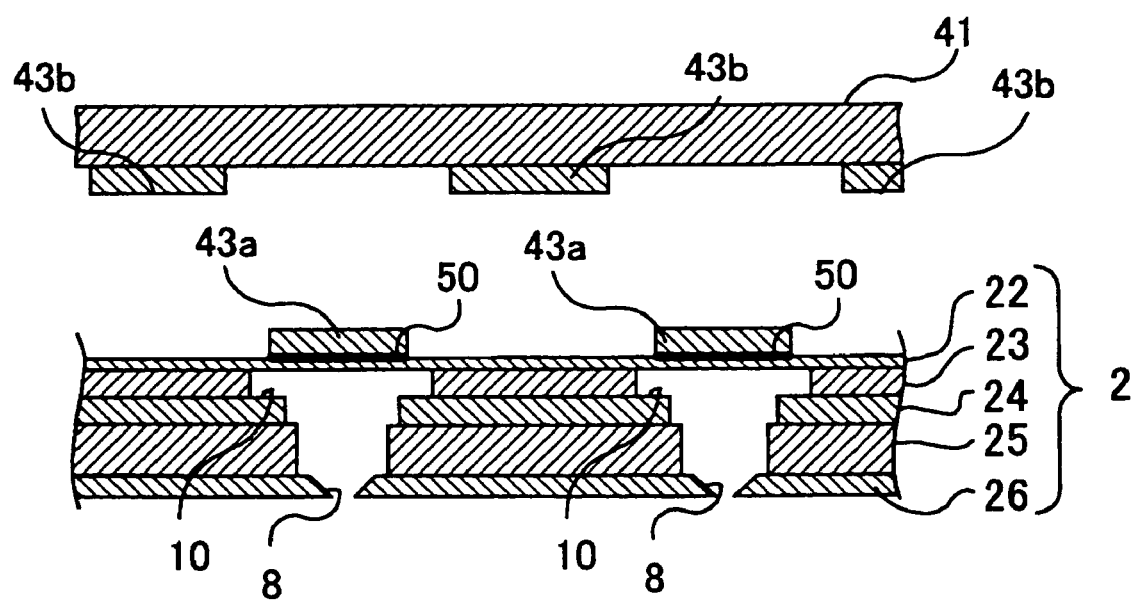

In the next step, the fired first segments 43a are separated from the jig substrate 41, by peeling the jig substrate 41 together with the fired second segment(s) 43b off the fluid passage unit 2 (FIG. 5B). Then, necessary steps including one for forming the upper electrode 35 on the fired first segments 43a are implemented, so as to complete the main body 100 of the ink jet head 1 as shown in FIG. 3.

According to the above-described first embodiment where the green sheet 42 is segmented with the laser beam 46, the conventional bothersome and time-consuming cleansing and segmenting steps (for instance, spraying coolant or lubricant, and cleansing for eliminating chips inevitably generated when dicing the piezoelectric ceramic sheet) which the operator would otherwise suffer from, are not involved in manufacturing the ink jet head 1. Therefore, the manufacture of the head 1 requires a relatively short time. In addition, since the step of firing the green sheet 42 is performed subsequent to the step of segmenting the green sheet 42, the yield of the fired first segments 43a of the piezoelectric ceramic sheet is improved, lowering the manufacturing cost of the ink jet head 1. Further, since the fired first segments 43a formed on the jig substrate 41 are bonded on the top plate 22 of the fluid passage unit 2 while the fired first segments 43a are integral with the jig substrate 41, the fired first segments 43a can be positioned at the respective nominal positions with higher accuracy than the case where individual fired first segments 43*a* are separately or one by one positioned and bonded on the top plate 22.

Further, since the fired first segments 43*a* of the piezoelectric ceramic sheet is bonded on the top plate 22 such that the respective positions of the fired first segments 43*a* correspond to the pressure chambers 10 and the surface area of each of the fired first segments 43*a* does not extend or spread beyond the surface area of the corresponding pressure chamber 10. Therefore, the liquid droplet delivery characteristics of the ink jet head 1 is enhanced, namely, the efficiency in the ink ejection from the nozzle 8 is improved.

Since the fired first segments 43*a* of the piezoelectric ceramic sheet is separated from the jig substrate 41 as shown in FIG. 5B, the deformation of the segments 43*a* is not disturbed by the presence of the jig substrate 41. On that account, in the step of forming the green sheet as shown in FIG. 4A, the green sheet 42 is formed to be separable from the jig substrate 41, thereby eliminating a risk of damaging the fired first segments 43*a* in the step of peeling the jig substrate 41 off the fluid passage unit 2 as shown in FIG. 5B.

Further, since the laser beam 46 is used to segment the green sheet 42 into a plurality of segments, as shown in FIG. 4B, the green sheet 42 can be segmented with high accuracy, which assures an enhanced dimensional accuracy of the obtained fired first segments 43*a*, facilitating widening the distance or groove between each adjacent two segments of the green sheet.

In the first embodiment, an epoxy adhesive having an electric conduction property is employed as the adhesive 50. Accordingly, the adhesive 50 can serve as the lower electrode 36. This arrangement eliminates necessity to provide in the form of an additional member an electrode between the first segments 43*a* and the top plate 22. Thus, the manufacturing process is further simplified. Still further, since not the entirety but only part of the surface of the top plate 22 is coated with the electrically conductive adhesive 50, wiring on the top plate 22 can be easily implemented.

Second Embodiment

There will now be described a second embodiment of the invention, which is different from the first embodiment in the member on which the adhesive 50 is applied. Illustration centered at this difference is provided, omitting description of the elements or features the same as those of the first embodiment which will be denoted by the same reference numerals.

Figure 6A:
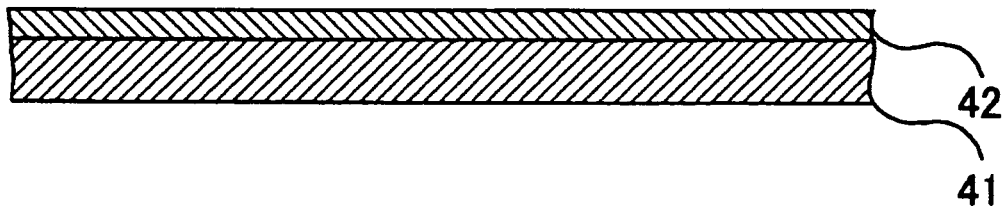
FIGS. 6A-6D are cross sectional views illustrating a method manufacturing an ink jet head according to a second embodiment of the invention, in the order of steps.
Figure 6B:
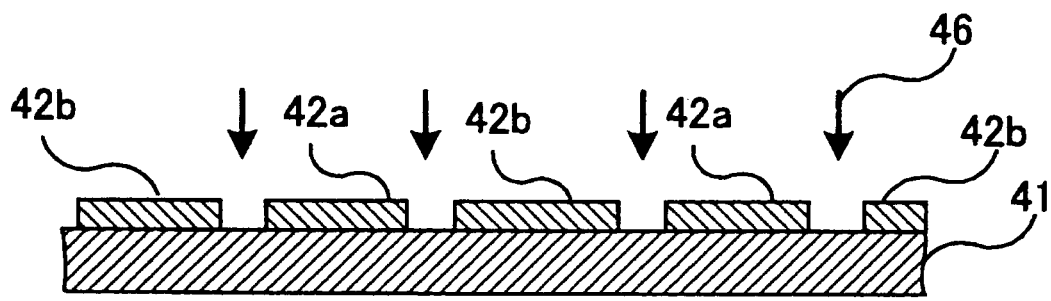
Figure 6C:
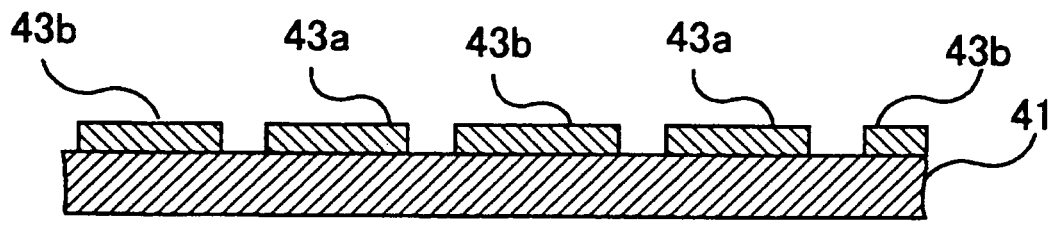

As shown in FIG. 6A, a green sheet 42 of a piezoelectric ceramic material is initially formed on a jig substrate 41 to have a uniform thickness, similarly to the step shown in FIG. 4A. Next, as shown in FIG. 6B, the green sheet 42 is segmented into a plurality of first segments 42*a* and at least one second segment 42*b* with a laser beam 46, similarly to the step shown in FIG. 4B. Subsequently, as shown in FIG. 6C, the first and second segments 42*a*, 42*b* of the green sheet 42 are fired into first and second segments 43*a*, 43*b* of a piezoelectric ceramic sheet, similarly to the step as shown in FIG. 4C.

Figure 6D:
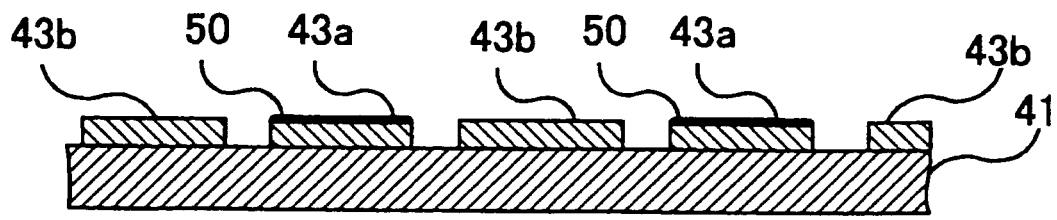

Then, an adhesive 50 is applied on surfaces of only the fired first segments 43*a*, as shown in FIG. 6D. The way of applying the adhesive 50 is the same as that illustrated with respect to FIG. 4E. Then, similarly to the step shown in FIG. 5A, the first and second segments 43*a*, 43*b* of the piezoelectric ceramic sheet are brought into contact with a top plate 22 of a fluid passage unit 2 as has been assembled beforehand. In this regard, the jig substrate 41 and top plate 22 are relatively positioned so that the first segments 43*a* and respectively corresponding pressure chambers 10 are appropriately aligned. Since only the first segments 43*a* are coated with the adhesive 50 and the second segment(s) 43*b* is/are not coated with the adhesive 50, the first segments 43*a* are bonded on the top plate 22 while the second segment(s) 43*b* is/are not. Then, there are implemented steps including a step where the first segments 43*a* of the piezoelectric ceramic sheet are separated from the jig substrate 41, by peeling the jig substrate 41 together with the second segment(s) 43*b* off the fluid passage unit 2, similarly to the step of FIG. 5B. Thus, the main body 100 of the ink jet head 1 as shown in FIG. 3 is completed.

According to the second embodiment, the same advantages as those of the first embodiment can be obtained.

Third Embodiment

There will be next described a third embodiment of the invention. According to a method of manufacturing the ink jet head 1 of the third embodiment, the range of the adhesive 50 as applied on the top plate 22 differs from that of the first embodiment. Illustration centered at this difference is provided, omitting description of the elements or features the same as those of the first embodiment which will be denoted by the same reference numerals.

Figure 7A:
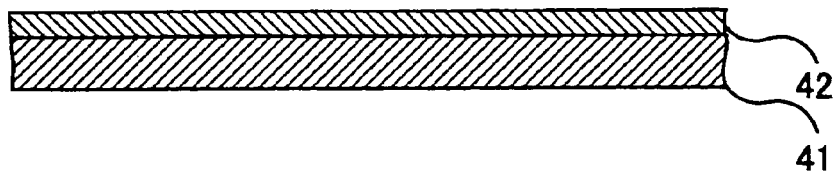
FIGS. 7A-7E are cross sectional views illustrating a method of manufacturing an ink jet head according to a third embodiment of the invention, in the order of steps.
Figure 7B:
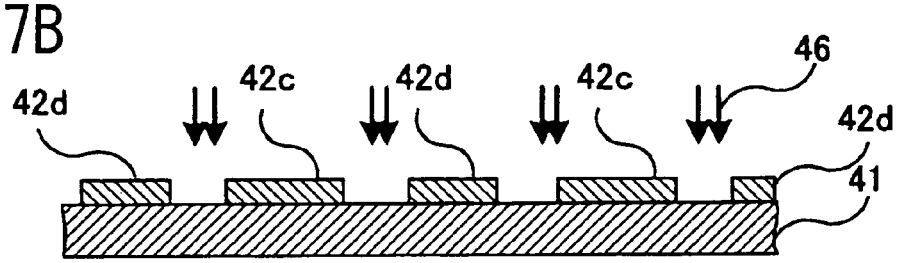
Figure 7C:
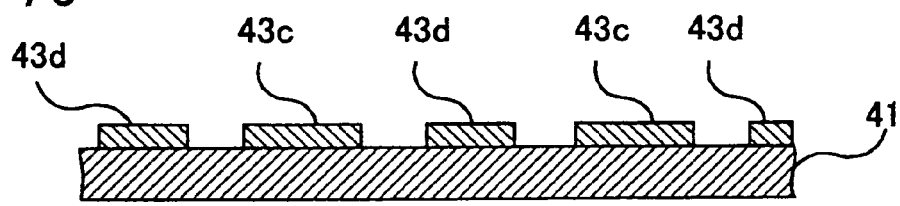

Similarly to the step of FIG. 4A, a green sheet 42 of a piezoelectric ceramic material is initially formed on a jig substrate 41 to have a uniform thickness, as shown in FIG. 7A. Next, as shown in FIG. 7B, the green sheet 42 is segmented into a plurality of first segments 42*c* and at least one second segment 42*d* with a laser beam 46, like the step shown in FIG. 4B. In this regard, it is noted that the first segment 42*c* has a size the same as that of the first segment 42*a* of the first embodiment, while the second segment 42*d* has a size smaller than that of the second segment 42*b* of the first embodiment. According to this arrangement, the second segment(s) 42*d* are not located above the pressure chambers 10 when seen in vertical cross section of the main body 100, to avoid disturbing the deflection of the top plate 22, as well as deterioration in the ink ejection characteristics of the ink jet head 1 due to a crosstalk which would be induced otherwise. Subsequently, as shown in FIG. 7C, the first and second segments 42*c*, 42*d* of the green sheet 42 are fired into first and second segments 43*c*, 43*d* of a piezoelectric ceramic sheet, similarly to the step as shown in FIG. 4C.

Figure 7D:
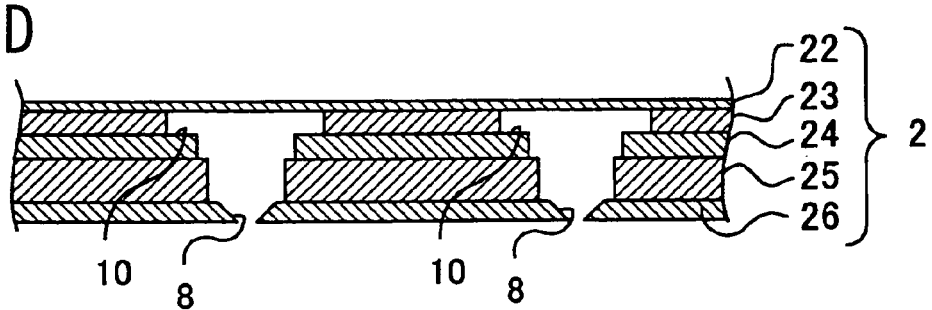
Figure 7E:
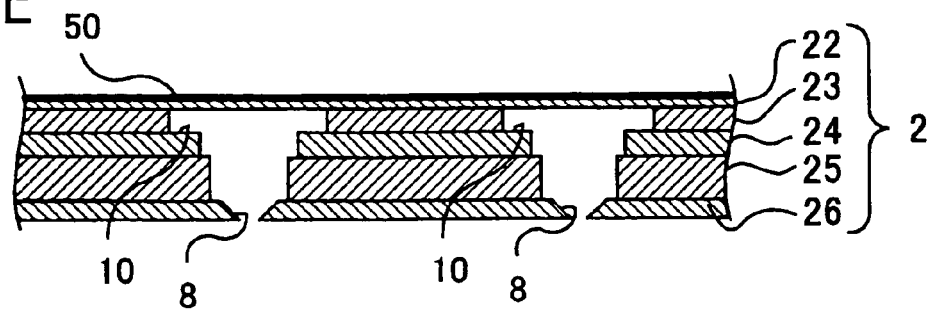

Similarly to the step shown in FIG. 4D, a fluid passage unit 2 is assembled as shown in FIG. 7D. Then, an adhesive 50 is applied on the entire surface of the top plate 22, as shown in FIG. 7E.

Figure 8A:
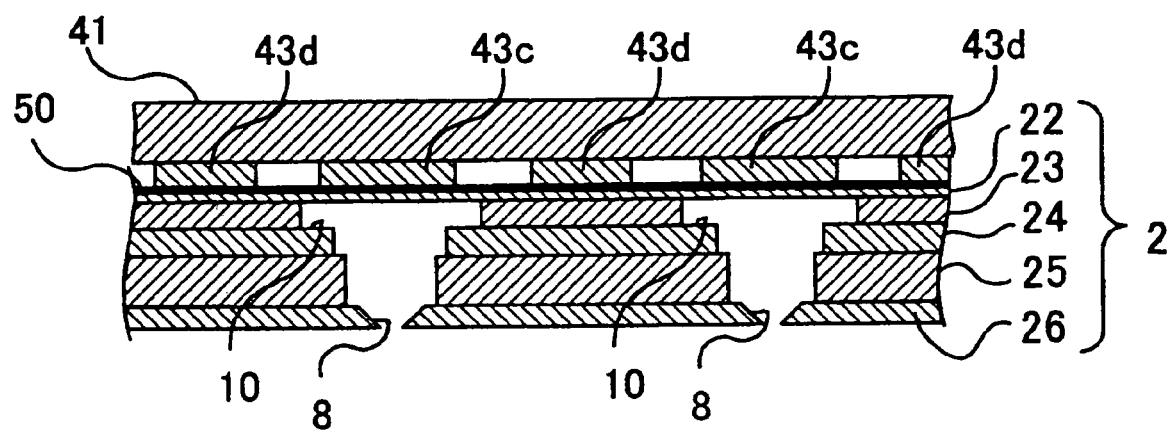
FIGS. 8A and 8B are cross sectional views illustrating steps implemented subsequently to the steps of FIGS. 7A-7E.

Subsequently, the first and second segments 43*c*, 43*d* of the piezoelectric ceramic sheet are brought into contact with the top plate 22 of the fluid passage unit 2. In this regard, the jig substrate 41 and the top plate 22 are relatively positioned such that the first segments 43*c* and respectively corresponding pressure chambers 10 are appropriately aligned. Since the entirety of the top plate 22 is coated with the adhesive 50, both the first and second segments 43*c*, 43*d* are bonded on the top plate 22, as shown in FIG. 8A.

Figure 8B:
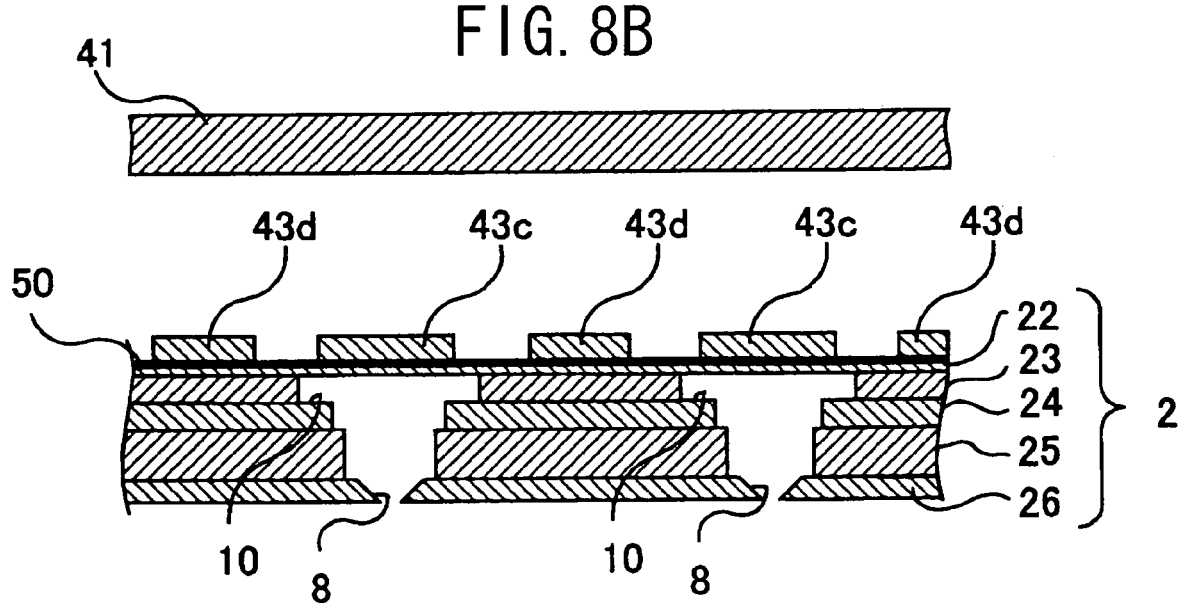

Next, the first and second segments 43*c*, 43*d* of the piezoelectric ceramic sheet are separated from the jig substrate 41, by peeling the jig substrate 41 off the fluid passage unit 2, as shown in FIG. 8B. Then, there are implemented steps including a step where an upper electrode 35 is formed on the first segments 43*c*. Thus, the main body 100 of the ink jet head 1 as shown in FIG. 3 is completed.

According to the third embodiment, the same advantages as those of the first embodiment can be obtained. In addition, since the entirety of the top plate 22 is coated with the adhesive 50, the step of applying the adhesive 50 is simplified in comparison with the first and second embodiments.

Additionally, since the laser beam 46 is employed to segment the green sheet 42 into the plurality of segments, i.e., first and second segments 42c, 42d, it is made easy to widen the distance or groove between each of the first segments 42c and its adjacent second segment or segments. In the thus manufactured ink jet head 1, the deflection of the top plate 22 is not disturbed since the second segment(s) 43d remaining on the top plate 22 via the adhesive 50 are not located above the pressure chambers 10. Further, since a width of the (each) second segment 43d as seen in cross section shown in FIGS. 7A-E, 8A and 8B is relatively narrow, the occurrence of crosstalk is inhibited.

Fourth Embodiment

There will now be described a fourth embodiment of the invention. A method of manufacturing an ink jet head 1 of the fourth embodiment differs from that of the third embodiment in the member on which the adhesive is applied. Illustration centered at this difference is provided, omitting description of the elements or features the same as those of the third embodiment which will be denoted by the same reference numerals.

Figure 9A:
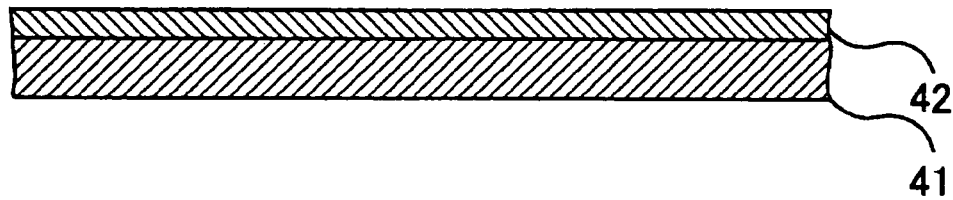
FIGS. 9A-9D are cross sectional views illustrating a method of manufacturing an ink jet head according to a fourth embodiment of the invention, in the order of steps.
Figure 9B:
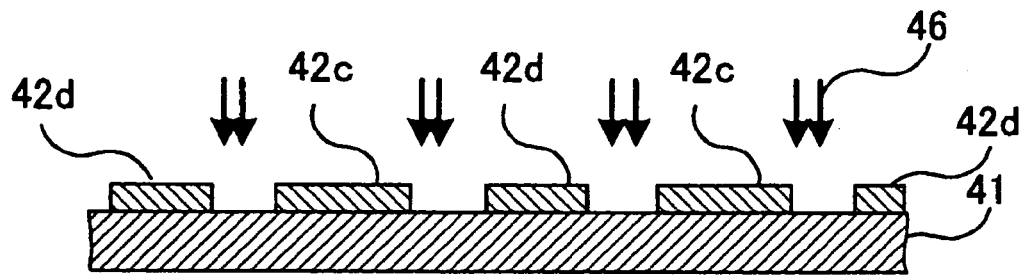
Figure 9C:
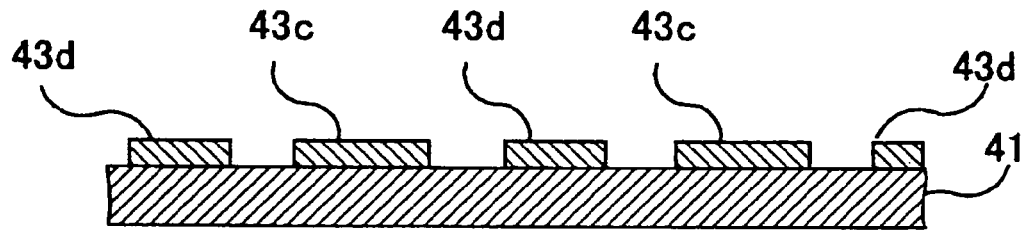

Similarly to the step of FIG. 7A, a green sheet 42 of a piezoelectric ceramic material is initially formed on a jig substrate 41 to have a uniform thickness, as shown in FIG. 9A. Next, as shown in FIG. 9B, the green sheet 42 is segmented into a plurality of first segments 42c and at least one second segment 42d with a laser beam 46, like the step shown in FIG. 7B. Subsequently, as shown in FIG. 9C, the first and second segments 42c, 42d of the green sheet 42 are fired into first and second segments 43c, 43d of a piezoelectric ceramic sheet, similarly to the step as shown in FIG. 7C.

Figure 9D:
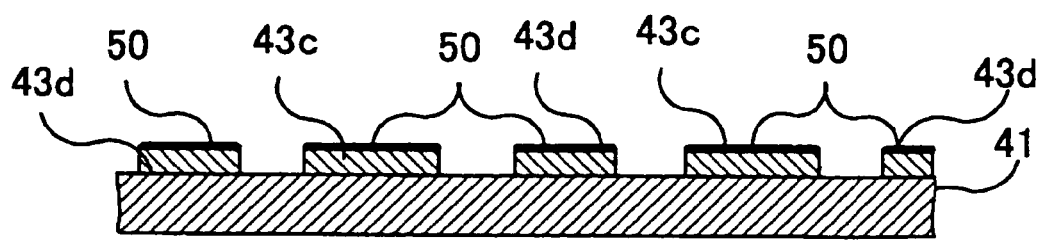

Then, an adhesive 50 is applied on only surfaces of the first and second segments 43c, 43d, as shown in FIG. 9D. The way of applying the adhesive 50 is similar to that as illustrated with respect to FIG. 4E. Subsequently, the first and second segments 43c, 43d of the piezoelectric ceramic sheet are brought into contact with the top plate 22 of the fluid passage unit 2 as has been assembled beforehand, as described with respect to FIG. 4D. In this regard, the jig substrate 41 and the top plate 22 are relatively positioned such that the first segments 43c and respectively corresponding pressure chambers 10 are appropriately aligned. Since the surfaces of both the first and second segments 43c, 43d are coated with the adhesive 50, both the first and second segments 43c, 43d are bonded on the top plate 22. Then, there are implemented steps including a step where the first and second segments 43c, 43d of the piezoelectric ceramic sheet are separated from the jig substrate 41 by peeling the jig substrate 41 off the fluid passage unit 2, as illustrated with regard to FIG. 8B. Thus, the main body 100 of the ink jet head 1 as shown in FIG. 3 is completed.

According to the fourth embodiment, the advantages same as those of the first embodiment can be obtained. Further, the time required for the application of the adhesive can be reduced.

Fifth Embodiment

There will next be described a fifth embodiment of the invention. A method of manufacturing the ink jet head 1 of the fifth embodiment differs from that of the second embodiment in that the fluid passage unit 2 does not include the top plate 22 closing the pressure chambers 10 and that the green sheet is accordingly laser-machined so that each of the segments of the piezoelectric ceramic sheet has a size to cover an entire surface area of a corresponding pressure chamber 10. Illustration centered at these differences is provided, omitting description of the elements or features the same as those of the second embodiment which will be denoted by the same reference numerals.

Figure 10A:
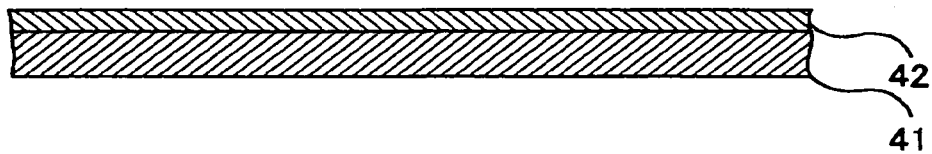
FIGS. 10A-10E are cross sectional views illustrating a method of manufacturing an ink jet head according to a fifth embodiment of the invention, in the order of steps.
Figure 10B:
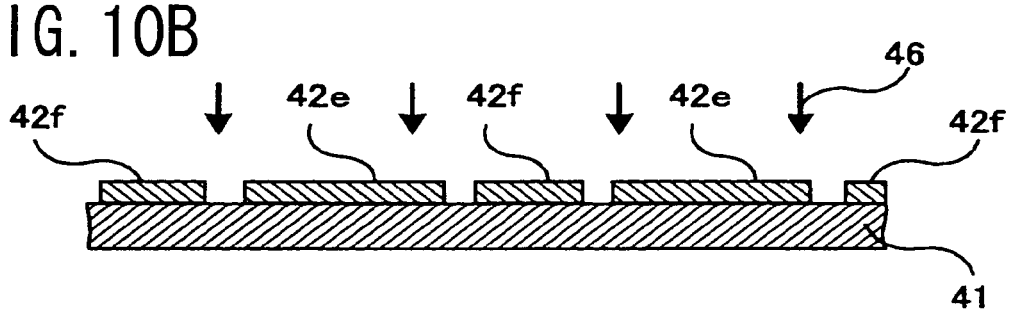
Figure 10C:
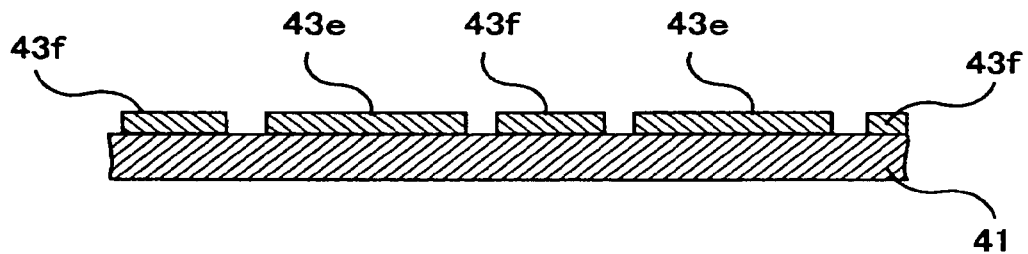
Figure 10D:
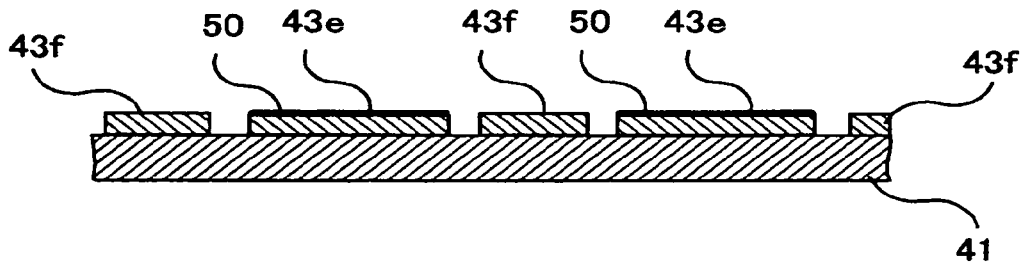

As shown in FIG. 10A, a green sheet 42 of a piezoelectric ceramic material is initially formed on a jig substrate 41 to have a uniform thickness, similarly to the step shown in FIG. 6A. Next, as shown in FIG. 10B, the green sheet 42 is segmented into a plurality of first segments 42e and at least one second segment 42f with a laser beam 46, like the step shown in FIG. 6B. A surface area of each of the first segments 42e is slightly larger than that of the pressure chamber 10, while a surface area of each of the at least one second segment 42f may be determined arbitrarily as long as there can be assured a sufficient distance or width of a groove between each of the first segments 42e and its adjacent second segment or segments 42f. Subsequently, as shown in FIG. 10C, the first and second segments 42e, 42f of the green sheet 42 are fired into first and second segments 43e, 43f of a piezoelectric ceramic sheet, like the step as shown in FIG. 6C. Then, an adhesive 50 is applied on surfaces of only the fired first segments 43e, as shown in FIG. 10D. The way of applying the adhesive 50 is the same as that illustrated with respect to FIG. 4E.

Figure 10E:
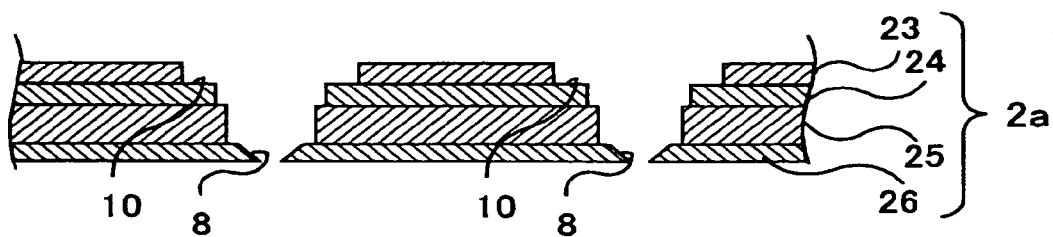

Meanwhile, separately from the steps shown in FIGS. 10A-10D, a fluid passage unit 2a is formed by bonding to one another the cavity plate 23, supply plate 24, manifold plate 25 and nozzle plate 26, which are superposed in the order of the description with being relatively positioned appropriately (FIG. 10E). As shown in FIG. 10E, the fluid passage unit 2a is arranged such that the pressure chambers 10 are not closed by a top plate, with the ink passage being exposed to the outside.

Figure 11A:
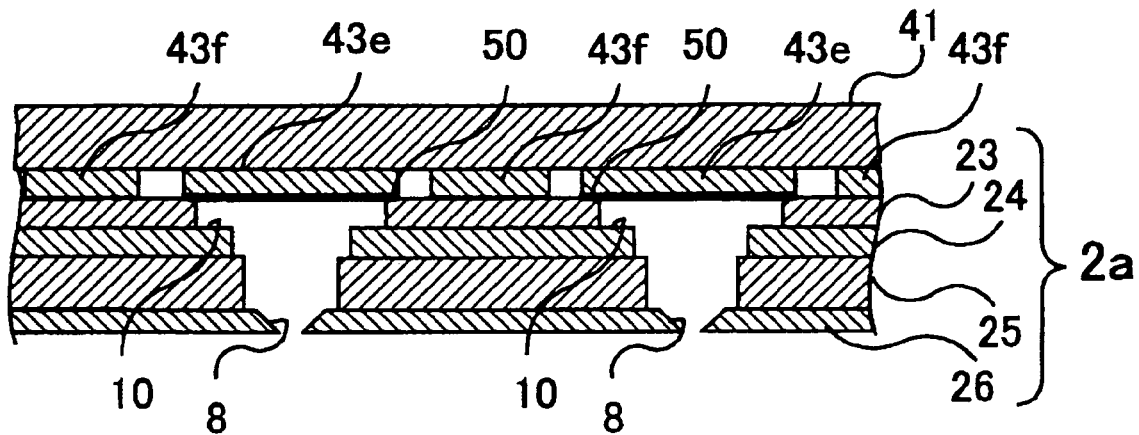
FIGS. 11A and 11B are cross sectional views illustrating steps implemented subsequently to the steps of FIGS. 10A-10E.

Then, the first and second segments 43e, 43f of the piezoelectric ceramic sheet are brought into contact with the cavity plate 23 of the fluid passage unit 2a as has been assembled as illustrated with respect to FIG. 10E. In this regard, the jig substrate 41 and cavity plate 23 are relatively positioned so that the first segments 43e and respectively corresponding pressure chambers 10 are appropriately aligned. Since only the first segments 43e are coated with the adhesive 50 and the second segment(s) 43f is/are not coated with the adhesive 50, the first segments 43e are bonded on the top plate 22 while the second segment(s) 43f is/are not, as shown in FIG. 11A.

Figure 11B:
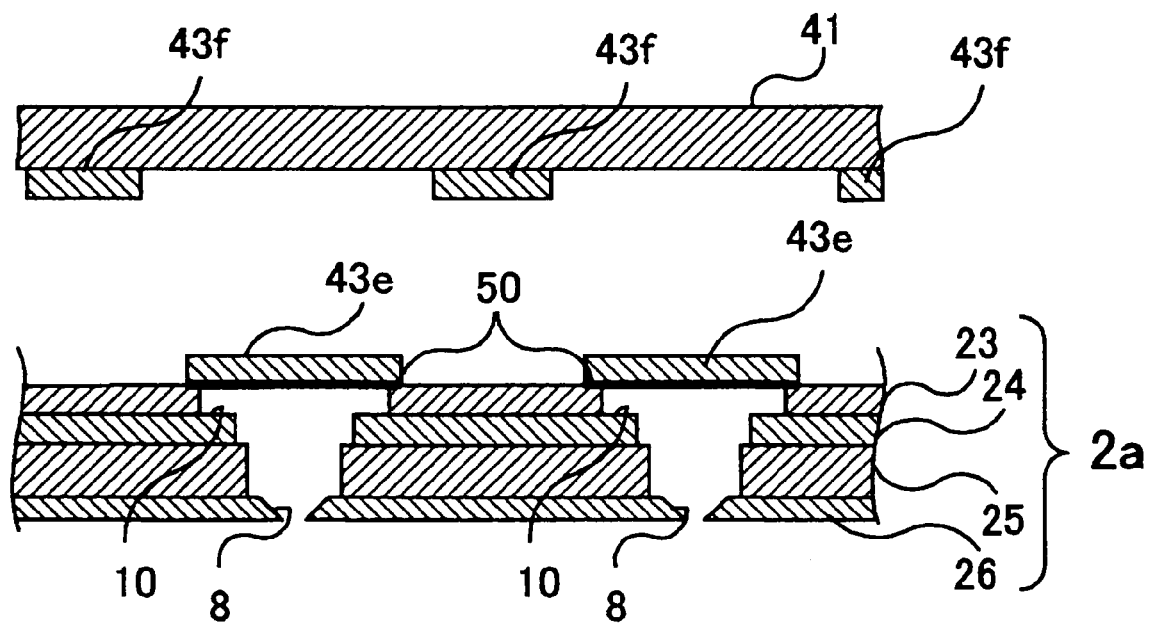

Then, there are implemented steps including a step where the first segments 43e of the piezoelectric ceramic sheet are separated from the jig substrate 41, by peeling the jig substrate 41 together with the second segment(s) 43f off the fluid passage unit 2a, as shown in FIG. 11B. Thus, a main body 100 of an ink jet head 1 is completed. It is noted that the main body 100 obtained according to the fifth embodiment is different from the main body as shown in FIG. 3, in that it is necessary to wire the lower electrode constituted by the adhesive 50 such that the lower electrode is held at a ground potential.

According to the fifth embodiment, the same advantages as those of the first embodiment can be obtained. However, since the fluid passage unit 2a does not have the top plate 22, the ink is ejected from the nozzle 8 by contraction of segments 43e of the piezoelectric ceramic sheet due to longitudinal piezoelectric effect, instead of the unimorph deformation as seen in the first to fourth embodiments.

Figure 12A:
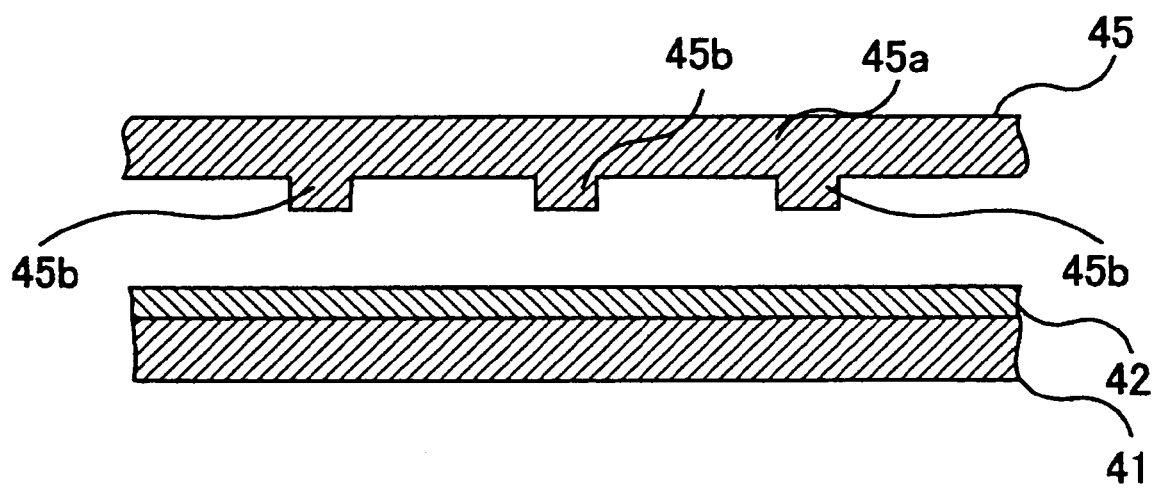
FIGS. 12A and 12B are cross sectional views illustrating a modification applicable to each of the first to fifth embodiments, with regard to the step of segmenting the green sheet.

There will be next described a modification applicable to each of the first through fifth embodiments described above. The modification relates, to the step of segmenting the green sheet. More specifically, the green sheet 42 is segmented into a plurality of segments by pressing a mold 45 onto the green sheet as shown in FIG. 12A. The mold 45 is a member having a plurality of projections 45b extending from the under surface of a planar portion 45a of the mold 45. The projection 45b has a height the same as that of each segment of the piezoelectric ceramic sheet, and the distance or width of the groove between adjacent two of the projections 45b is the same as that between each adjacent two of the segments of the piezoelectric ceramic sheet.

Figure 12B:
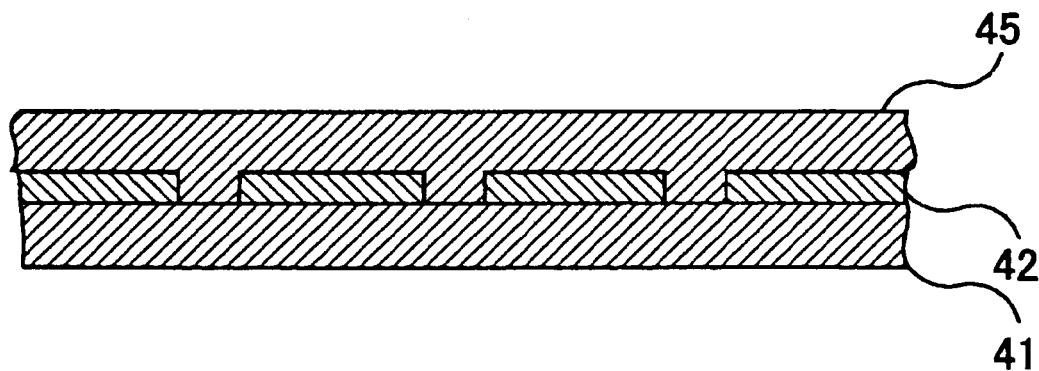

Thus, by pressing the mold 45 onto the green sheet 42 as shown in FIG. 12B, the green sheet 42 is segmented, forming the segments of the green sheet 42 between the respective two adjacent projections 45b.

With the above modification applied, each of the first through fifth embodiments need not use an expensive machine, such as the laser light source, to segment the green sheet into the plurality of segments. This lowers the manufacturing cost of the ink jet head.

It is to be understood that the first through fifth embodiments of the invention is not limited to the details as described above, but may be modified variously within the scope of the invention as defined in the appended claims. For instance, although in the first through fourth embodiments the segments of the piezoelectric ceramic sheet are bonded on the top plate 22 such that the positions of the segments correspond to those of the pressure chambers 10, with a surface area of each of the segments not extending or spreading beyond that of each of the pressure chambers 10, the surface area of each segment of the piezoelectric ceramic sheet may partially extend beyond the surface area of the pressure chamber 10. Further, the segment of the piezoelectric ceramic sheet may have a planar shape not similar to that of the pressure chamber 10. Still further, the adhesive 50 may be an electrically non-conductive adhesive.

In addition, although in each of the above-described embodiments the planar shape and the size of the green sheet as applied on the jig substrate are made substantially the same as those of the top plate of the fluid passage unit, this arrangement is not essential.

Further, although in each of the above-described embodiments the segments of the piezoelectric ceramic sheet are bonded on the fluid passage unit as separately prepared whether the fluid passage unit includes the top plate or not, this arrangement is not essential; namely, it may be arranged such that the segments of the piezoelectric ceramic sheet are first bonded or fixed to the top plate or diaphragm which is not yet bonded to the other plates to together constitute the fluid passage unit, and then the top plate or diaphragm integral with the segments of the piezoelectric ceramic sheets is bonded to the other plates.

The ink jet head is not limited to a line head, but may be a serial head. In a case where the ink jet head is a serial head, it may be arranged such that the ink jet head is controlled to reciprocate in the direction perpendicular to the sheet feeding or conveying direction. The method of manufacturing the ink jet head according to the invention illustrated by reference to the several embodiments thereof is very widely applicable to a method of manufacturing various kinds of liquid-droplet ejecting apparatus for forming dots of a liquid on a printing medium, such as: a liquid-droplet ejecting apparatus for printing a fine electric circuit pattern with an electrically conductive paste as a liquid to be ejected from the nozzle of the head; and a liquid-droplet ejecting apparatus used in manufacturing a high-resolution display device such as organic electroluminescence display (OELD) which employs an organic light-emitting material as a liquid to be ejected.

Sixth Embodiment

Figure 14:
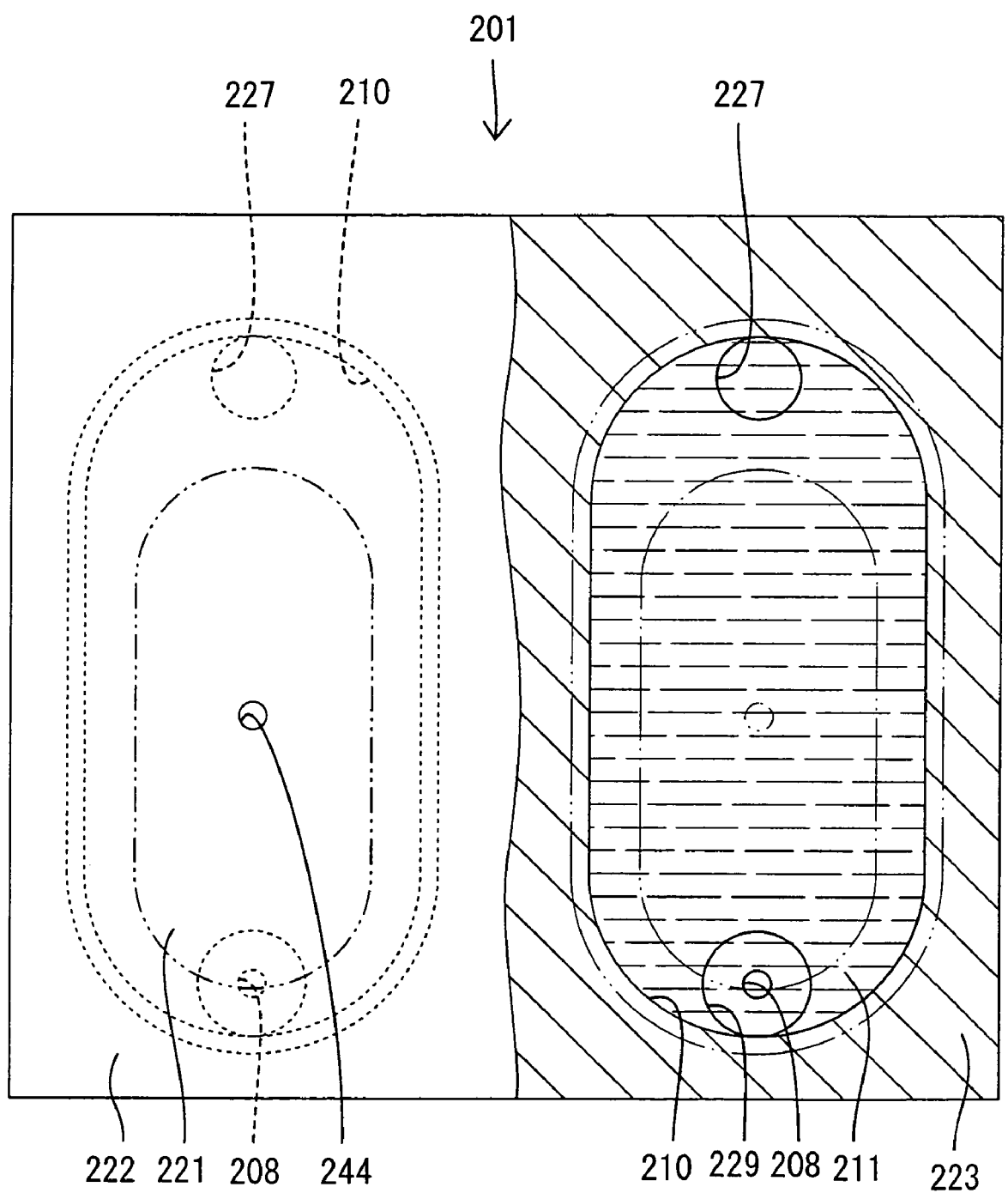
FIG. 14 is a plan view of the ink jet head as partially fractured.
Figure 15:
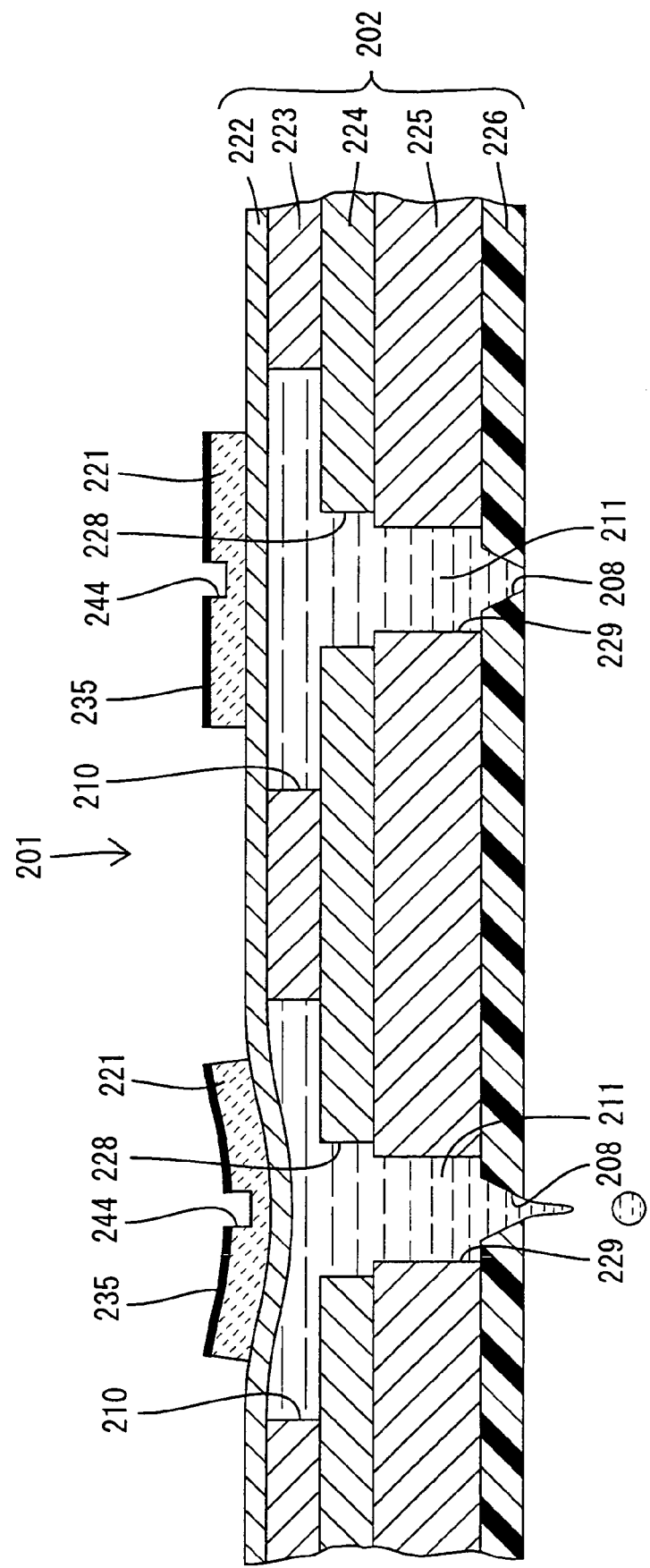
FIG. 15 shows a cross section of the ink jet head taken along a line extending in the direction of a row of pressure chambers.

There will now be described a sixth embodiment of the invention by reference to FIGS. 13-19. According to the sixth embodiment, an ink jet head 201 as a kind of liquid delivery apparatus to be used in an ink jet printer (not shown) is manufactured. FIG. 13 is a cross sectional view of the ink jet head 201 as taken along a line extending in a longitudinal direction of a pressure chamber 210 of the head 201. FIG. 14 is a plan view of the head 201 as partly fractured; while FIG. 15 is a cross sectional view of the head 201 as taken along a line extending in a direction of a row of a plurality of the pressure chambers 210.

The ink jet head 201 comprises a fluid passage unit 202 including the plurality of pressure chambers 210 each accommodating an ink 211 (which constitutes a "liquid" as defined in the present invention), and piezoelectric ceramic sheets 221 bonded on the fluid passage unit 202.

The fluid passage unit 202 has a laminar structure comprising a nozzle plate 226, a manifold plate 225, a supply plate 224, a cavity plate 223 and a top plate 222 which are superposed in this order. These plates 222-226 are bonded to one another with an epoxy adhesive having a thermosetting property.

The cavity plate 223 is made of a metallic material such as a stainless steel and has a plurality of through-holes each having an oblong shape and partially defining one of the pressure chambers 210. The supply plate 224 is made of a metallic material such as a stainless steel and has through-holes defining a plurality of manifold passages 227 and a plurality of pressure passages 228. The manifold passages 227 are in communication with one of the opposite end portions in the longitudinal direction of the respective pressure chambers 210, while the pressure passages 228 are in communication with the other end portion of the respective pressure chambers 210. The manifold plate 225 is made of a metallic material such as a stainless steel and has through-holes to partially define a common ink chamber 205 in communication with an ink tank (not shown) and a plurality of nozzle passages or communication holes 229 in communication with the respective pressure passages 228. The nozzle plate 226 is made of a polyimide resin and has through-holes as nozzles 208 (which correspond to "openings" as defined in the present invention) for ejecting the ink 211 therethrough. The nozzles 208 are in communication with the nozzle passages or communication holes 229. Thus, there is defined an ink passage for each pressure chamber 210, which originates from the common ink chamber 205 connected to the ink tank and terminates at the nozzle 208 via the manifold passage 227, pressure chamber 210, pressure passage 228 and nozzle passage or communication hole 229.

The piezoelectric ceramic sheets 221 are bonded on a top plate 222 serving as a diaphragm, at respective positions corresponding to the plurality of pressure chambers 210. The top plate 222 is made of a metallic material having an electric conduction property, such as a stainless steel, and is bonded on the cavity plate 223 with a thermoset epoxy adhesive having an electric conduction property. The top plate 222 functions as a lower electrode also, and is connected to a ground of a driver circuit (not shown).

The piezoelectric ceramic sheet 221 is formed of a piezoelectric ceramic material such as a lead (Pb)-zirconate-titanate (PZT). As shown in FIG. 14, each pressure chamber 210 has an oblong rectangular shape with rounded corners as seen from the upper side. Each piezoelectric ceramic sheet 221 also has a similar oblong rectangular shape with rounded corners, but one size smaller than that of the pressure chamber 210. The piezoelectric ceramic sheet 221 is bonded to the upper surface of the top plate 222 with an electrically conductive adhesive, such that the centerline of the piezoelectric ceramic sheet 221 extending in its longitudinal direction is aligned with that of the corresponding pressure chamber 210. At the center on the upper surface of the piezoelectric ceramic sheet 221, there is formed a dent 244 which conforms to a positioning protrusion 243 of a jig substrate 241 as will be described later.

On the upper surface of the piezoelectric ceramic sheet 221, there is formed an upper electrode 235 electrically connected to a driver circuit via a conductive wire (not shown). The upper electrode 235 is a conductive film member, and is bonded or printed on the piezoelectric ceramic sheet 221 which has been subjected to a polarization treatment. When the driver circuit is activated to make an electric potential of the upper electrode 235 higher than that of the top plate 222 as the lower electrode, an electric field is applied onto the piezoelectric ceramic sheet 221 in the direction of the polarization (i.e., the direction from the upper electrode 235 toward the lower electrode). Hence, the piezoelectric ceramic sheet 221 deflects in the direction of thickness thereof, contracting in the planar direction thereof (i.e., the horizontal direction as seen in FIGS. 13 and 15). Accordingly, as shown in the left-hand side in FIG. 15, the piezoelectric ceramic sheet 221 and the top plate 222 are together locally deformed or deflected toward the pressure chamber 210. In other words, there takes place the unimorph deformation. Thus, the inner volume of the pressure chamber 210 is reduced, pressurizing the ink accommodated in the pressure chamber 210, and eventually ejecting the ink from the nozzle 208. After that with the electric potential of the upper electrode 235 restored to its original level, which is the same as that of the electric potential of the lower electrode or the top plate 222, the piezoelectric ceramic sheet 221 and the top plate 222 are restored to their original shapes. The inner volume of the pressure chamber 210 is accordingly restored to its original volume, with the ink 211 being sucked in from the common ink chamber 205 into the pressure chamber 210.

There will be next described a method of manufacturing the ink jet head 201 by reference to FIGS. 16-19.

In forming the piezoelectric ceramic sheets 221, the jig substrate 241 which is made of a heat-resistant material such as alumina is employed, as shown in FIG. 16A. On the upper surface of the jig substrate 241, there are provided a plurality of positioning protrusions 243 (which correspond to "positioning portions" as defined in the present invention). One positioning protrusion 243 is provided for each of a plurality of first segments 242a (each of which is to be formed into a piezoelectric ceramic sheet 221) as formed on the jig substrate 241, as will be described later. Each of the positioning protrusions 243 has a cylindrical shape, in other words, a shape of the body of revolution having an axis perpendicular to a surface of the jig substrate 241.

Initially, a slurry prepared by dispersing ceramic particles, such as lead (Pb)-zirconate-titanate (PZT), in a binder resin is applied on the upper surface of the jig substrate 241, so as to form a green sheet 242. This is a green sheet laminating step shown in FIG. 16A. In this step, the dents 244 conforming to the positioning protrusions 243 are formed in the under surface of the green sheet 242.

Figure 17:
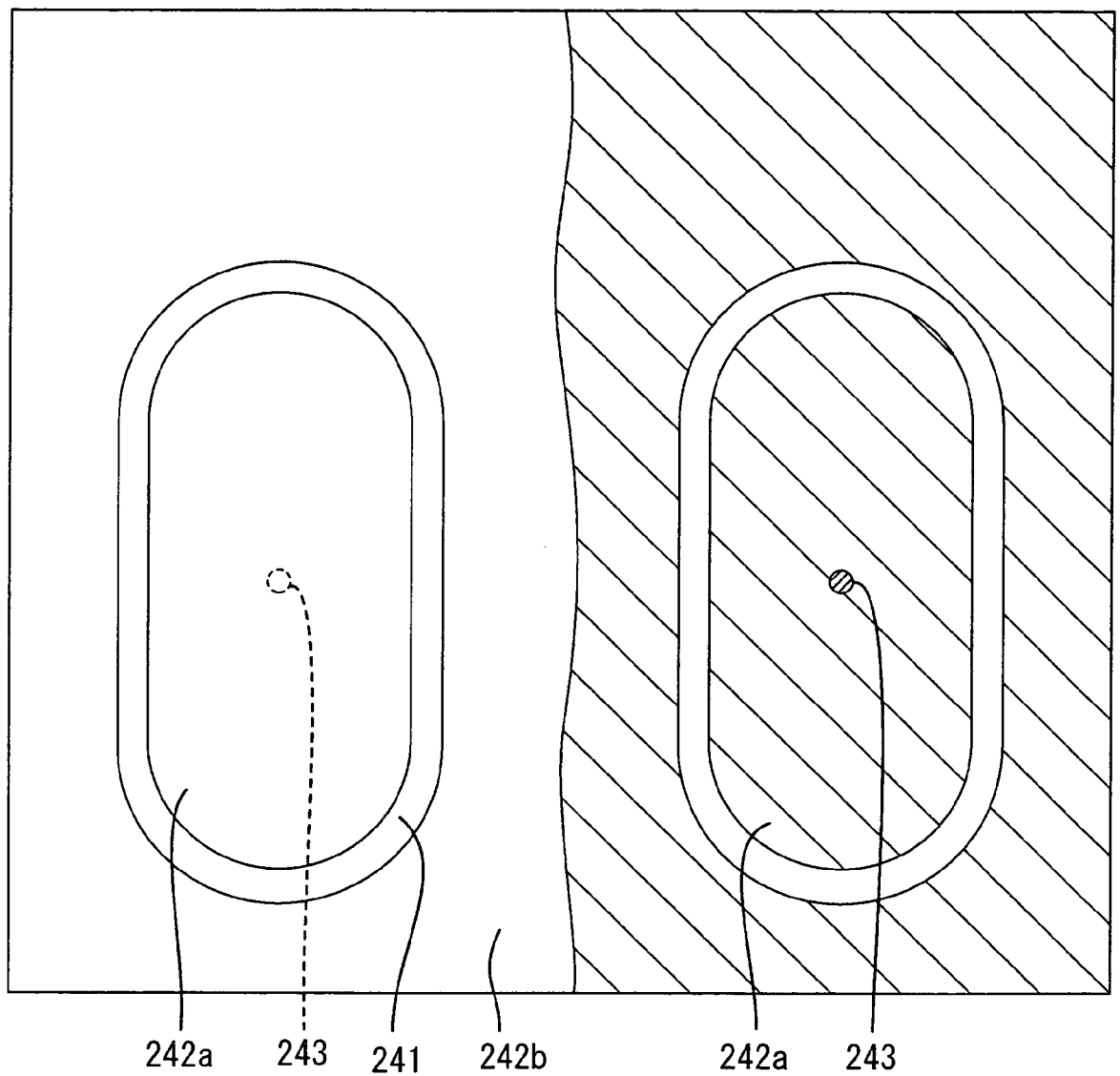
FIG. 17 is a plan view of the ink jet head as partially fractured, in the state where the green sheet on the jig substrate has been segmented.

Then, with a laser beam 246 as emitted from a YAG laser light source (not shown), the green sheet 242 is segmented into a plurality of first segments 242a and at least one second (or nonuse) segment 242b to be discarded eventually. This is a segmenting step as shown in FIGS. 16B and FIG. 17. The positions of the first segments 242a on the jig substrate 241 correspond to respective positions of the pressure chambers 210 in the fluid passage unit 202. The shape of the first segment 242a is substantially similar to, but slightly smaller than, the planar shape of the pressure chamber 210. The positioning protrusion 243 is positioned relatively to the first segment 242a such that the position of the protrusion 243 corresponds to the center of the first segment 242a. The size of the positioning protrusion 243 is determined to be sufficiently smaller than that of the first segment 242a. Instead of the above-described step of forming the first and second segments 242a, 242b of the green sheet 242 by segmenting the green sheet 242 with the laser beam 246, there may be employed a step of pressing a suitable jig or mold onto the green sheet 242 on the jig substrate 241 to form the segments 242a, 242b. In either case, the green sheet 242 is segmented before the green sheet 242 is fired, which omits use of large machinery, simplifying the required operations.

Subsequently, a firing step as shown in FIG. 16C is implemented to fire the green sheet 242 or segments 242a, 242b thereof on the jig substrate 241. When fired, the segments 242a, 242b of the green sheet 242 shrinks about 20-30%. In this regard, since each first segment 242a engages with the positioning protrusion 243 at the dent 244 to be held appropriately positioned, a marginal portion of the each segment 242a displaces toward the center of the segment 242a as the firing progresses, while the center portion of the segment 242a does not virtually displace. Further, since the protrusion 243 has the cylindrical shape, that is, a shape of the body of revolution, there is prevented the occurrence of concentration of stress at the portion of the segment 242a where shrinkage has taken place during the firing step. This is effective to prevent cracking or distortion from occurring around the positioning protrusion 243.

Meanwhile, the nozzle plate 226, manifold plate 225, supply plate 224, cavity plate 223 and top plate 222 are superposed on and bonded to one another with being relatively positioned appropriately. This is a step of forming a fluid passage unit. In this regard, respective through-holes to define the nozzles 208, pressure chambers 210, common ink chamber 205, and others have been beforehand formed in the plates 223-226. The relative positioning is performed by aligning relevant through-holes with one another, so that there is formed inside the fluid passage unit the ink passage originating from the common ink chamber 205 and terminating at the nozzle 208 through the pressure chamber 210.

Figure 18:
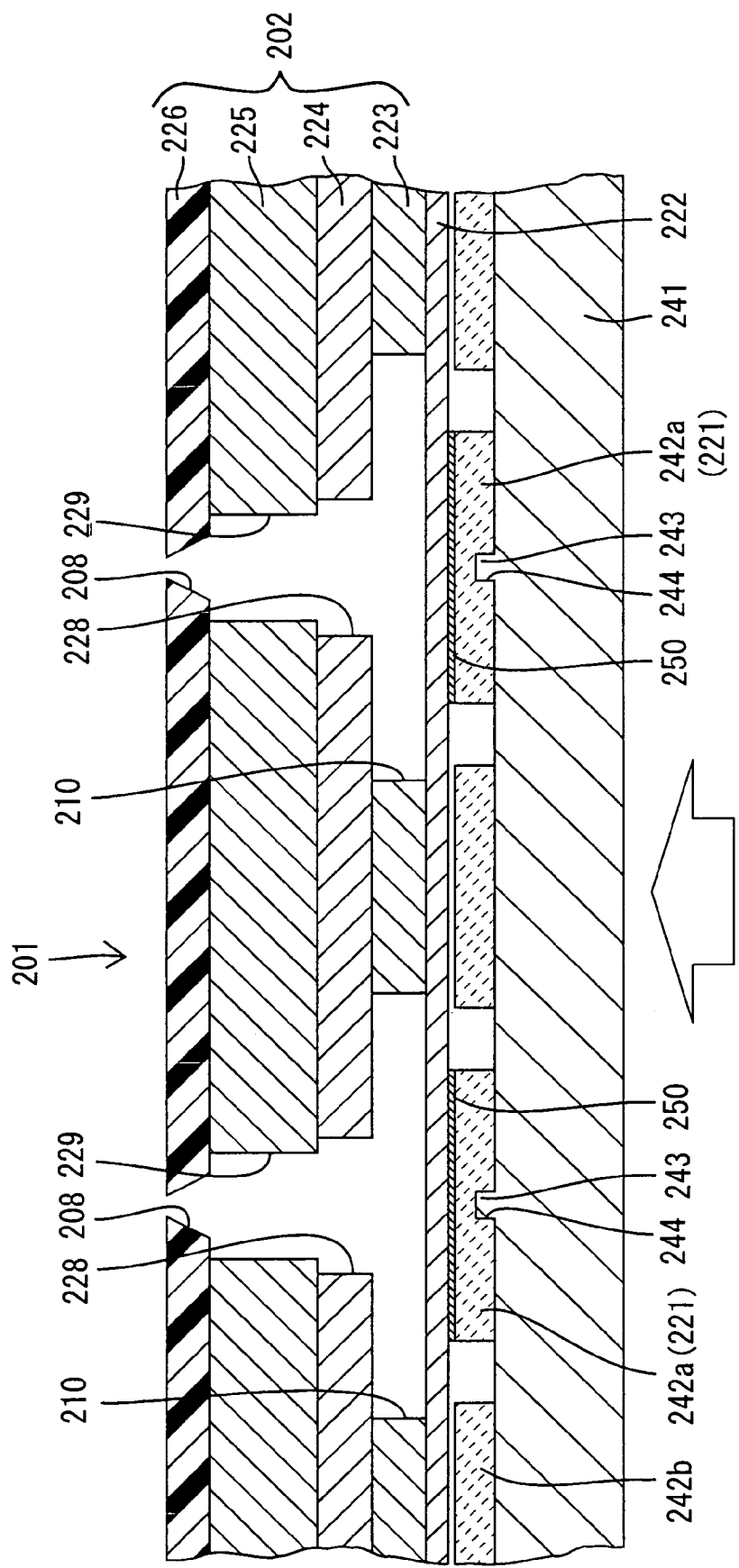
FIG. 18 shows a cross section showing a state where a diaphragm is pressed onto piezoelectric ceramic sheets on the jig substrate.

Subsequently, an electrically conductive adhesive 250 is applied on the upper surface of the top plate 222 in a pattern corresponding to that of arrangement of the first segments 242a or the piezoelectric ceramic sheets 221. That is, the adhesive 250 is applied only at the portions where the first segments 242a are to be disposed. The way of applying the adhesive 250 is, for instance, as follows. An entire surface of a planar member (not shown) is initially coated with the adhesive 250 with a uniform thickness. Then, a mold having recesses which are arranged in a pattern similar to the arrangement of the pressure chambers 210 and each of which has a shape conforming to that of the first segment 242a is pressed onto the planar member coated with the adhesive 250, so as to partially eliminate the adhesive 250. Subsequently, pieces of the adhesive 250 remaining on the planar member in the same pattern as that of the pressure chambers 210, each piece having the same shape as that of the first segment 242a, are transferred onto the top plate 222, such that positions of the pieces of the transferred adhesive 250 align with the positions of the respectively corresponding pressure chambers 210. In this regard, the surface area or shape of each piece of the remaining adhesive 250 is adjusted to be the same as, or substantially similar to but a little larger than, that of the piezoelectric ceramic sheet 221 or first segment 242a. By this arrangement, an adhesion failure between the top plate 222 and the piezoelectric ceramic sheet 221 is prevented. Then, the top plate 222 and the jig substrate 241 are relatively positioned, and the top plate 222 is pressed onto the first segments 242a (piezoelectric ceramic sheets 221) and second segment(s) 242b. This is a bonding step as shown in FIG. 18. In this regard, with being positioned or fixed in location on the jig substrate 241 by the positioning protrusion 243, each segment 242a is prevented from being displaced from its nominal position. It is noted that instead of the above-described bonding step, the following step may be employed: Initially, the adhesive 250 is applied on only the surfaces of the first segments 242a (piezoelectric ceramic sheets 221) on the jig substrate 241, in a manner similar to the above-described process, and then the top plate 222 is pressed onto the segments 242a.

Subsequently, the adhesive 250 is solidified, and the jig substrate is peeled off the fluid passage unit 202, being separated from the first segments 242a left bonded on the top plate 222 with the adhesive 250. This is a peeling step as shown in FIG. 19. Thus, there can be obtained the top plate 222 on which is bonded a plurality of the piezoelectric ceramic sheets 221 or first segments 242a, arranged in the desired pattern.

In the above-described bonding step, the adhesive 250 is applied on the first segments 242a as have been fired and positioned correspondingly to the pressure chambers 210, by transferring from the planar member. However, the adhesive 250 may be directly applied on the first segments 242a.

Further, the bonding and peeling steps may be as follows: The fired first and second (or nonuse) segments 242a, 242b are coated with the adhesive 250 over their entire surfaces, then the top plate 222 is pressed onto the coated surfaces of the segments 242a, 242b, to bond both the first and second segments 242a, 242b to the top plate 222, and the first and second segments 242a, 242b are separated from or peeled off the jig substrate 241. In either case, according to the present sixth embodiment, the second or nonuse segment(s) 242b is/are disposed above the portion where the cavity plate 223 and top plate 222 are bonded to each other, enhancing the rigidity of the portion. This arrangement is advantageous in that the deflection of the top plate 222 taking place at the position corresponding to the pressure chamber 210 is inhibited from propagating to the adjacent pressure chamber or chambers 210, that is, a crosstalk is inhibited from occurring.

Subsequently, the upper electrodes 235 are formed on the first segments 242a or the piezoelectric ceramic sheets 221 by bonding or printing. This is an electrode forming step. Then, a polarizing step is implemented where an electric field, which has an intensity higher than that applied when the normal activation for ink ejection is performed, is applied between the upper electrodes 235 and the top plate 222 as the lower electrode, so as to polarize the piezoelectric ceramic sheet 221 interposed between the upper and lower electrodes, in the direction of the thickness of the sheet 221. Thus the ink jet head 201 is completed.

Since the positioning protrusions 243 are provided on the jig substrate 241, the sixth embodiment as described above is effective to prevent displacement of the piezoelectric ceramic sheets 221 or first segments 242a during firing thereof due to the shrinkage of the sheets 221 or first segments 242a. Further, since the protrusions 243 are positioned correspondingly to the pattern of the arrangement of the pressure chambers 210, the accuracy in positioning the first segments 242a or the piezoelectric ceramic sheets 221 on the top plate 222 is enhanced. Accordingly, deterioration in ink delivery characteristics of the ink jet head 201 due to disalignment of the piezoelectric ceramic sheets 221 can be avoided, as well as density of the piezoelectric ceramic sheets can be enhanced, which enables to downsize the ink jet head 201.

In the bonding step of the sixth embodiment, the adhesive 250 is applied on the top plate 222 only at the positions corresponding to the pattern of the arrangement of the piezoelectric ceramic sheets 221 or first segments 242a, and the top plate 222 is pressed onto the piezoelectric ceramic sheets 221 or first segments 242a as have been fired. Accordingly, among the first and second segments 242a, 242b formed on the jig substrate 241, only the segments corresponding to the pattern, that is, the first segments 242a, are selectively transferred onto the top plate 222.

In the above-described alternative bonding step, the entire surfaces of the first and second segments 242a, 242b that have been fired are coated with the adhesive 250 and then the top plate 222 is pressed onto the coated surfaces of the segments 242a, 242b. This step is more simplified in comparison with the selective bonding step, since there is no need to apply the adhesive 250 in a patterned fashion.

When shrinking, the first segment 242a or piezoelectric ceramic sheet 221 displaces from its nominal position. In general, the more away from the positioning protrusion 243, the more the segment 242a or sheet 221 displaces. However, according to the present embodiment where the positioning protrusion 243 is disposed at the position corresponding to the center of the first segment 242a or piezoelectric ceramic sheet 221, the displacement of the piezoelectric ceramic sheet 221 as a whole can be reduced, in comparison with the case where the positioning protrusion 243 is disposed at a position corresponding to a marginal portion of the first segment 242a or piezoelectric ceramic sheet 221. In a case where the piezoelectric ceramic sheet 221 is a two-dimensional or planar member having a uniform thickness, as in the sixth embodiment, the positioning protrusion 243 is disposed at the position corresponding to the center of the planar shape of the piezoelectric ceramic sheet 221 or first segment 242a. On the other hand, in a case where the piezoelectric ceramic sheet 221 has a three-dimensional or cubic shape having a surface not uniform, the positioning protrusion 243 is disposed at the position corresponding to the center of gravity of the piezoelectric ceramic sheet 221 or first segment 242a.

Further, since the positioning protrusion 243 has the shape of the body of revolution having an axis perpendicular to the surface of the jig substrate 241, the shrinkage of the piezoelectric ceramic sheet 221 (first segments 242a) around the positioning protrusion 243 is relatively isotropic, preventing occurrence of cracking and distortion there.

Figure 20A:
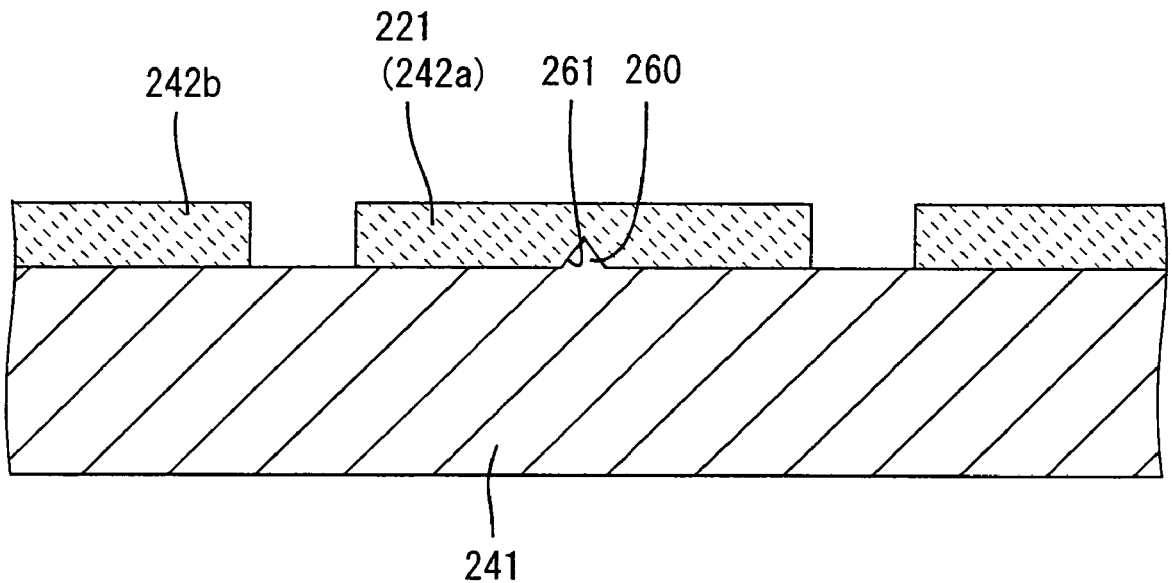
FIGS. 20A and 20B respectively show a step of forming piezoelectric ceramic sheets in a method of manufacturing an ink jet head according to a modification of the sixth embodiment.
Figure 20B:
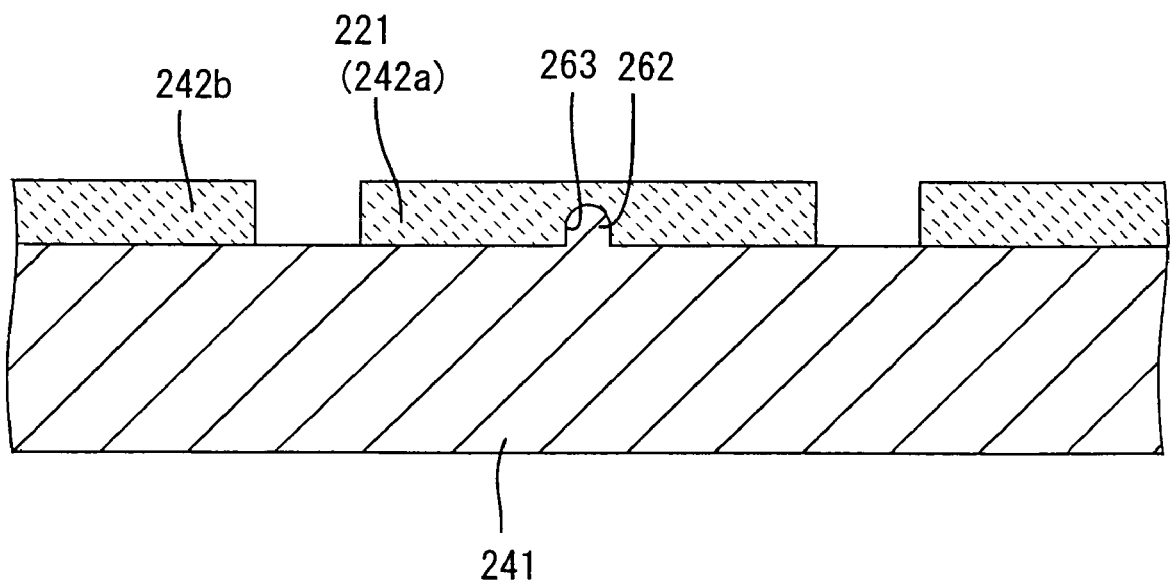

FIGS. 20A and 20B respectively show a modification of the sixth embodiment. A positioning protrusion 260 as shown in FIG. 20A has a circular conical shape. In other words, a circumferential surface of the positioning protrusion 260 is tapered down to a point; and the protrusion 260 has a shape of the body of revolution having an axis perpendicular to the surface of the jig substrate 241. The first segment 242a or piezoelectric ceramic sheet 221 as has been fired has a cone-shaped dent 261 conforming to the positioning protrusion 260 of the circular conical shape. The constitution of this modification of the sixth embodiment other than the part described above is the same as that of the sixth embodiment.

According to the modification, in the peeling step described above the positioning protrusion 260 can be smoothly detached from the dent 261 of the first segment 242a or piezoelectric ceramic sheet 221 as bonded to the top plate 222, as well as the effects the same as those of the sixth embodiment can be obtained. Further, the arrangement where the positioning protrusion 260 is tapered down to a point prevents an occurrence of cracking or the like around the positioning protrusion 260 when the shrinkage of the first segment 242a of the piezoelectric ceramic sheet 221 takes place.

FIG. 20B shows another modification of the sixth embodiment where a positioning protrusion 262 which comprises a base portion having a cylindrical shape and an upper portion having a substantially semispherical shape continuing from the base portion. That is, the positioning protrusion 262 has an end portion chamfered, thereby preventing occurrence of cracking or distortion around the positioning protrusion 262 when the shrinkage of the first segment 242a of the piezoelectric ceramic sheet 221 takes place. Also, the positioning protrusion 262 has a shape of the body of revolution having an axis perpendicular to the surface of the jig substrate 241. In the under surface of the piezoelectric ceramic sheet 221 is formed a dent 263 having a shape conforming to the positioning protrusion 262.

Figure 21A:
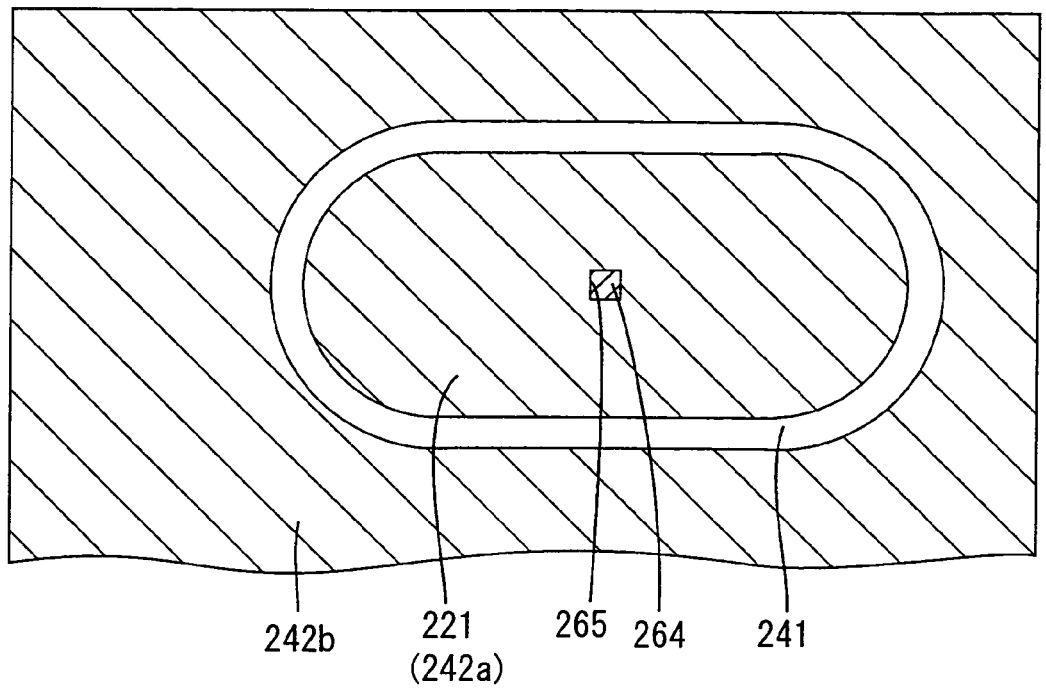
FIGS. 21A and 21B are plane cross sections respectively showing a step of forming piezoelectric ceramic sheets in a method of manufacturing an ink jet head according to another modification of the sixth embodiment.
Figure 21B:
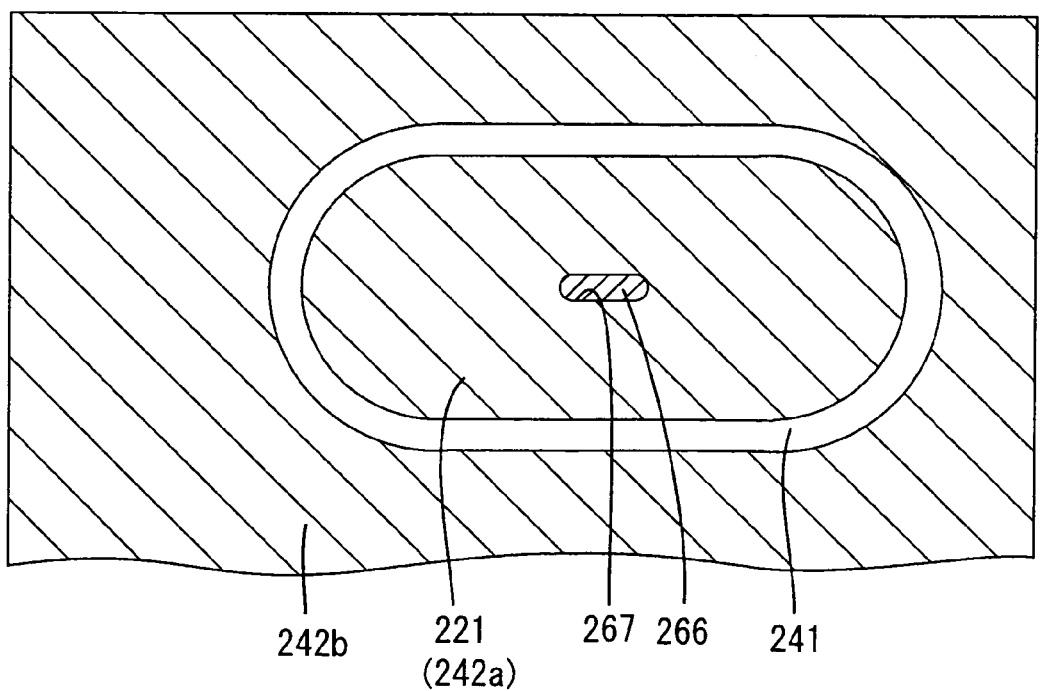

FIGS. 21A and 21B respectively show another modification of the sixth embodiment. A positioning protrusion 264 as shown in FIG. 21A has a prismatic shape which is foursquare in cross section. In the under surface of the first segment 242a or piezoelectric ceramic sheet 221 is formed a dent 265 having a shape conforming to the positioning protrusion 264.

A positioning protrusion 266 shown in FIG. 21B is in cross section a rounded rectangle which is long in the longitudinal direction of the first segment 242a or piezoelectric ceramic sheet 221. The piezoelectric ceramic sheet 221 has a dent 267 having a shape conforming to the positioning protrusion 266.

Seventh Embodiment

Figure 22A:
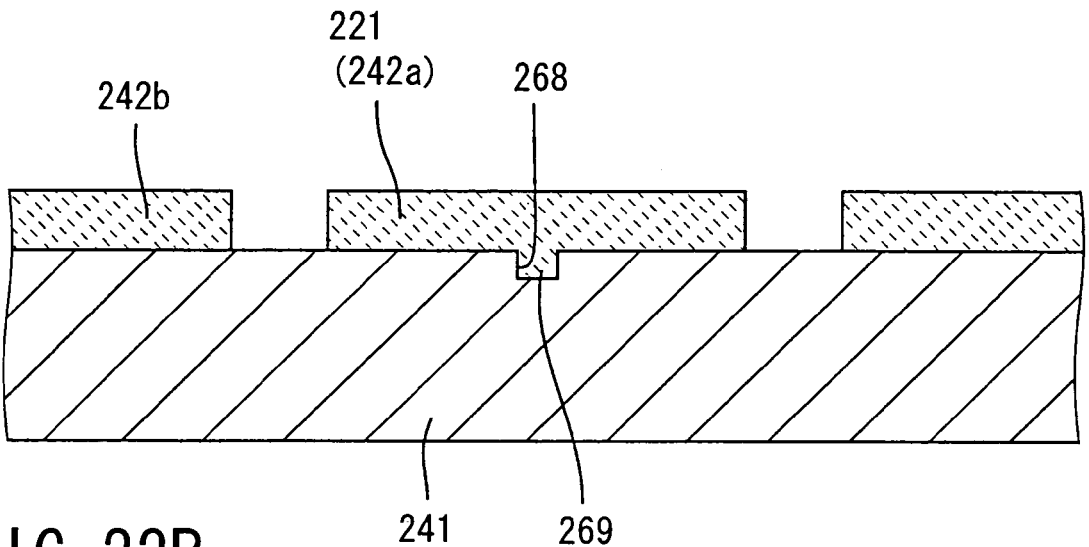
FIG. 22A shows a step of forming piezoelectric ceramic sheets in a method of manufacturing an ink jet head according to a seventh embodiment of the invention, while FIGS. 22B and 22C respectively show a step of forming piezoelectric ceramic sheets in a method of manufacturing an ink jet head according to a modification of the seventh embodiment.

There will be described a seventh embodiment of the invention by reference to FIGS. 22A-22C. In the following description, elements or features the same as those of the sixth embodiment will be denoted by the same reference numerals and illustration thereof is omitted.

In an upper surface of a jig substrate 241 is formed a plurality of positioning dents 268 (which correspond to "positioning portions" as defined in the present invention). One positioning dent 268 is provided for each of the piezoelectric ceramic sheet 221 (first segment 242a) formed on the jig substrate 241, and is disposed at a position corresponding to the center of the each first segment 242a. The positioning dent 268 is in cross section a circle and has a diameter constant throughout its vertical length, that is, the positioning dent 268 has a shape of the body of revolution having an axis perpendicular to the surface of the jig substrate 241. In the under surface of the first segment 242a or piezoelectric ceramic sheet 221 is formed a protrusion 269 of a cylindrical shape conforming to the positioning dent 268.

According to the seventh embodiment where the positioning dent 268 is provided in the form of a hollow formed in the surface of the jig substrate 241, the displacement of the piezoelectric ceramic sheet 221 (first segment 242a) taking place due to the shrinkage of the first segment 242a while the sheet 221 is fired is effectively prevented. Accordingly, accuracy in positioning each piezoelectric ceramic sheet 221 on the top plate 222 when bonded to each other is enhanced.

Figure 22B:
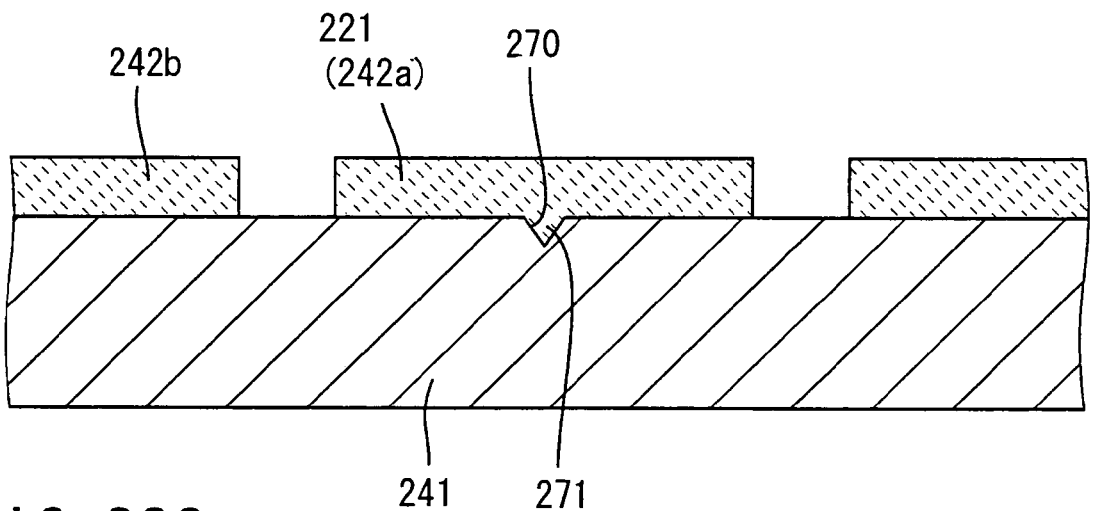

FIG. 22B shows a modification of the seventh embodiment. A positioning dent 270 has a tapered surface, i.e., an inverted conical shape. In other words, the positioning dent 270 has a shape of the body of revolution having an axis perpendicular to the surface of the jig substrate 241. The first segment 242a or piezoelectric ceramic sheet 221 has a protrusion 271 having a circular conical shape conforming to the positioning dent 270. According to this modification, the protrusion 271 of the first segment 242a or piezoelectric ceramic sheet 221 as bonded to the top plate 222 is smoothly detachable from the positioning dent 270. Also, the arrangement where the positioning dent 270 is tapered down to a point prevents an occurrence of cracking or the like around the positioning dent 270 when the shrinkage of the first segment 242a of the piezoelectric ceramic sheet 221 takes place.

Figure 22C:
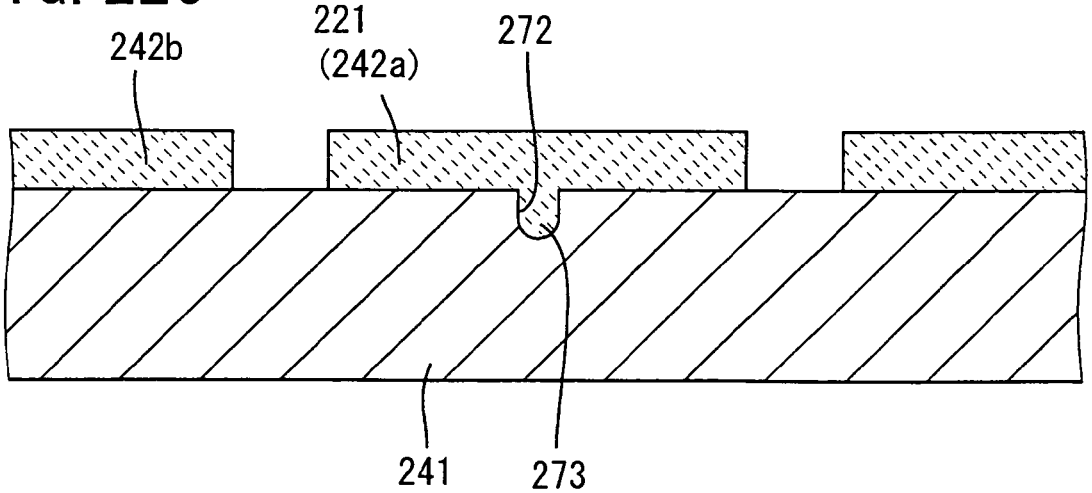

FIG. 22C shows another modification of the seventh embodiment, in which a positioning dent 272 has an upper cylindrical portion which is circular in cross section, and a lower semispherical portion. In other words, the positioning dent 272 has a shape of the body of revolution having an axis perpendicular to the surface of the jig substrate 241, and includes a bottom portion whose edges and corners are chamfered. In the under surface of the first segment 242a or piezoelectric ceramic sheet 221 is formed a protrusion 273 having a shape conforming to the positioning dent 272.

The seventh embodiment may be modified such that the positioning dent 268 is in cross section a foursquare, rectangular, or ellipse, for instance.

In any one of the seventh embodiment and its modifications indicated above, the positioning dent has a shape of the body of revolution, thereby preventing the occurrence of concentration of stress at the portion of the segment 242a where shrinkage has taken place during the firing step.

Eighth Embodiment

Figure 23A:
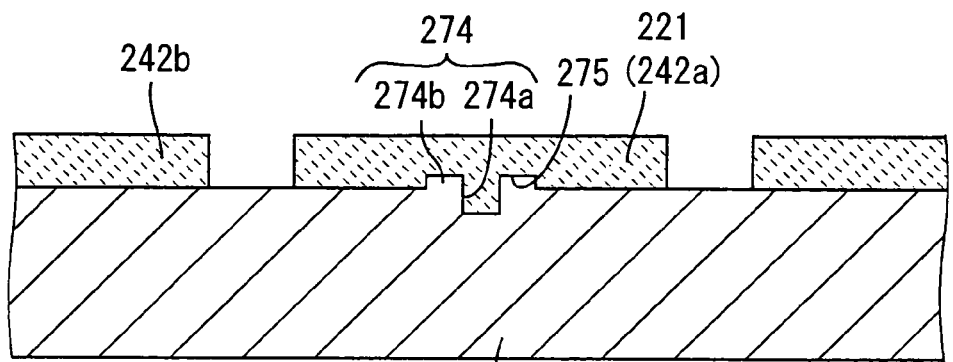
Figure 23B:
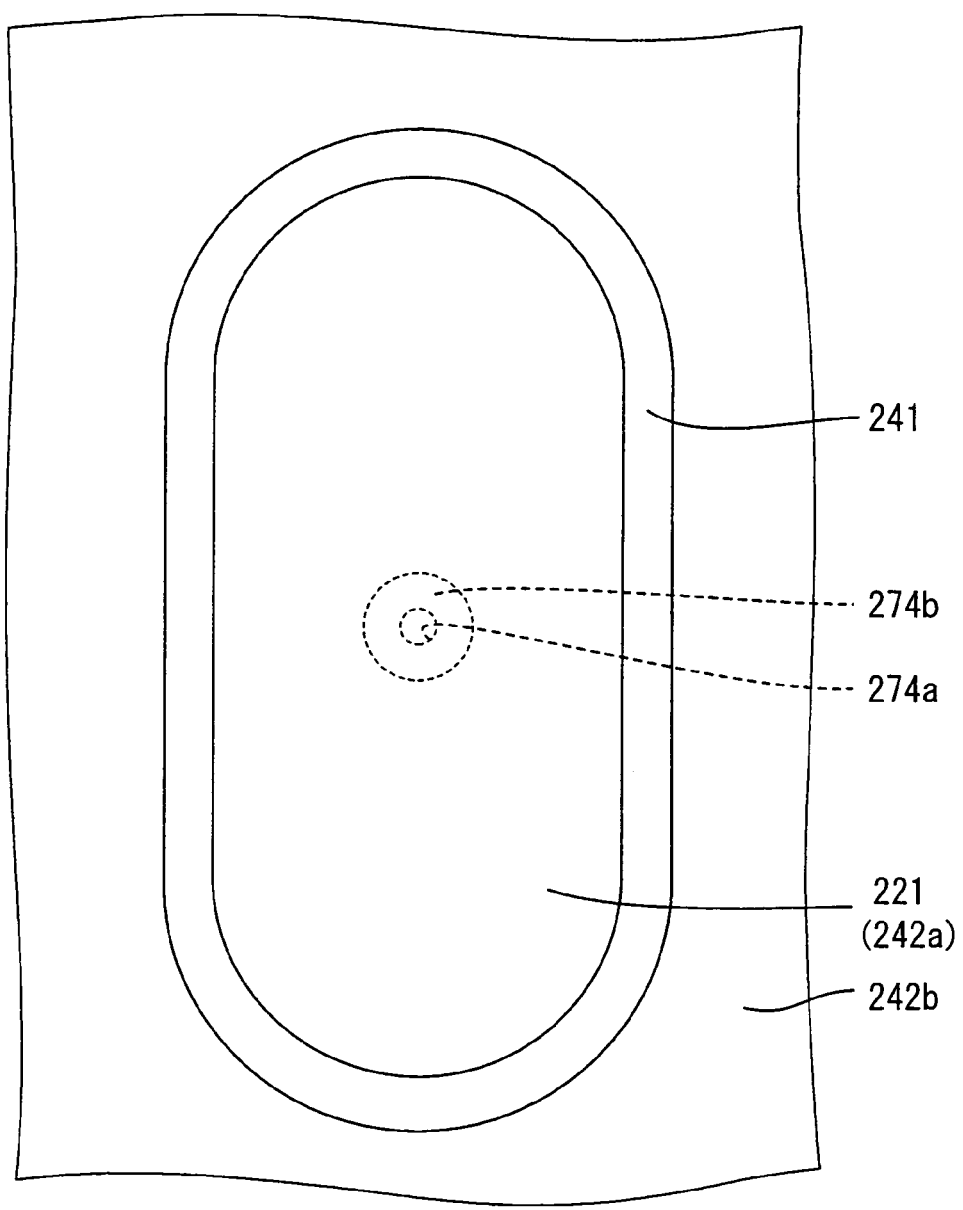
FIG. 23B is a plan view corresponding to FIG. 23A.

There will be now described an eighth embodiment of the invention by reference to FIGS. 23A and 23B. In the following description, elements and features the same as those of the sixth embodiment will be denoted by the same reference numerals and illustration thereof is omitted.

The positioning portion 274 comprises a positioning dent 274a which is a circle in cross section and has a diameter constant throughout its vertical length, and an annular positioning protrusion 274b which is disposed at an outer periphery of the positioning dent 274a and coaxial with the positioning dent 274a. The positioning portion 274 according to the eighth embodiment also has a shape of the body of revolution having an axis perpendicular to the surface of the jig substrate 241. In the first segment 242a or piezoelectric ceramic sheet 221 is formed a positioning portion 275 comprising a protrusion and a dent respectively conforming to the dent 274a and protrusion 274b of the positioning portion 274 of the jig substrate 241. The advantages substantially the same as those of the sixth embodiment can be obtained according to the eighth embodiment.

Although in the above description the eighth embodiment is arranged such that the positioning portion 274 is presented in concentric circles, or, the dent and protrusion 274a, 274b depict two concentric circles, when seen from the upper side, the planar shape of the positioning portion 274 may be otherwise. For instance, the planar shape of each of the dent and protrusion 274a, 274b may be a foursquare, a rectangle or an ellipse. Further, although in the embodiment shown n FIGS. 23A and 23B, the upper and bottom surfaces of the positioning portion 274, that is, the upper annular surface of the protrusion 274b and the bottom surface of the dent 274a, are both plane, each of these surfaces may be curved.

Ninth Embodiment

There will next be described a ninth embodiment of the invention by reference to FIGS. 24A and 24B. In the following description, elements and features the same as those of the first embodiment will be denoted with the same reference numerals and description thereof is omitted.

Figure 24A:
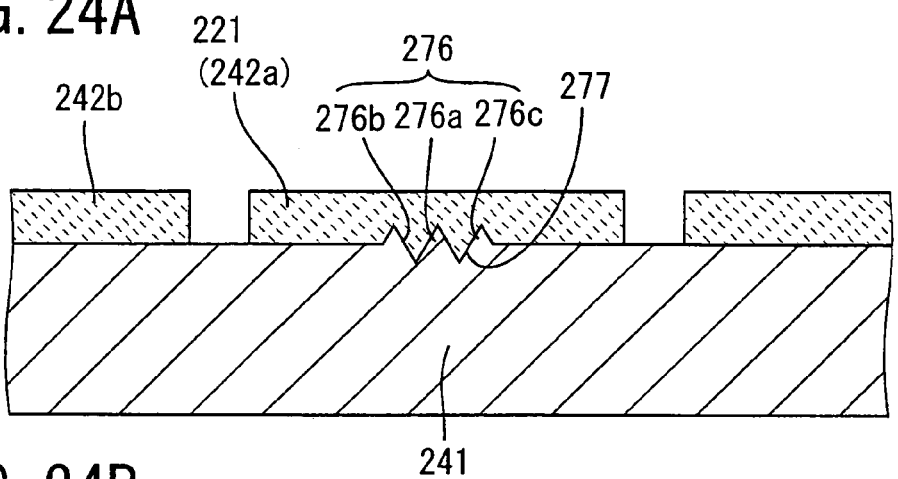
Figure 24B:
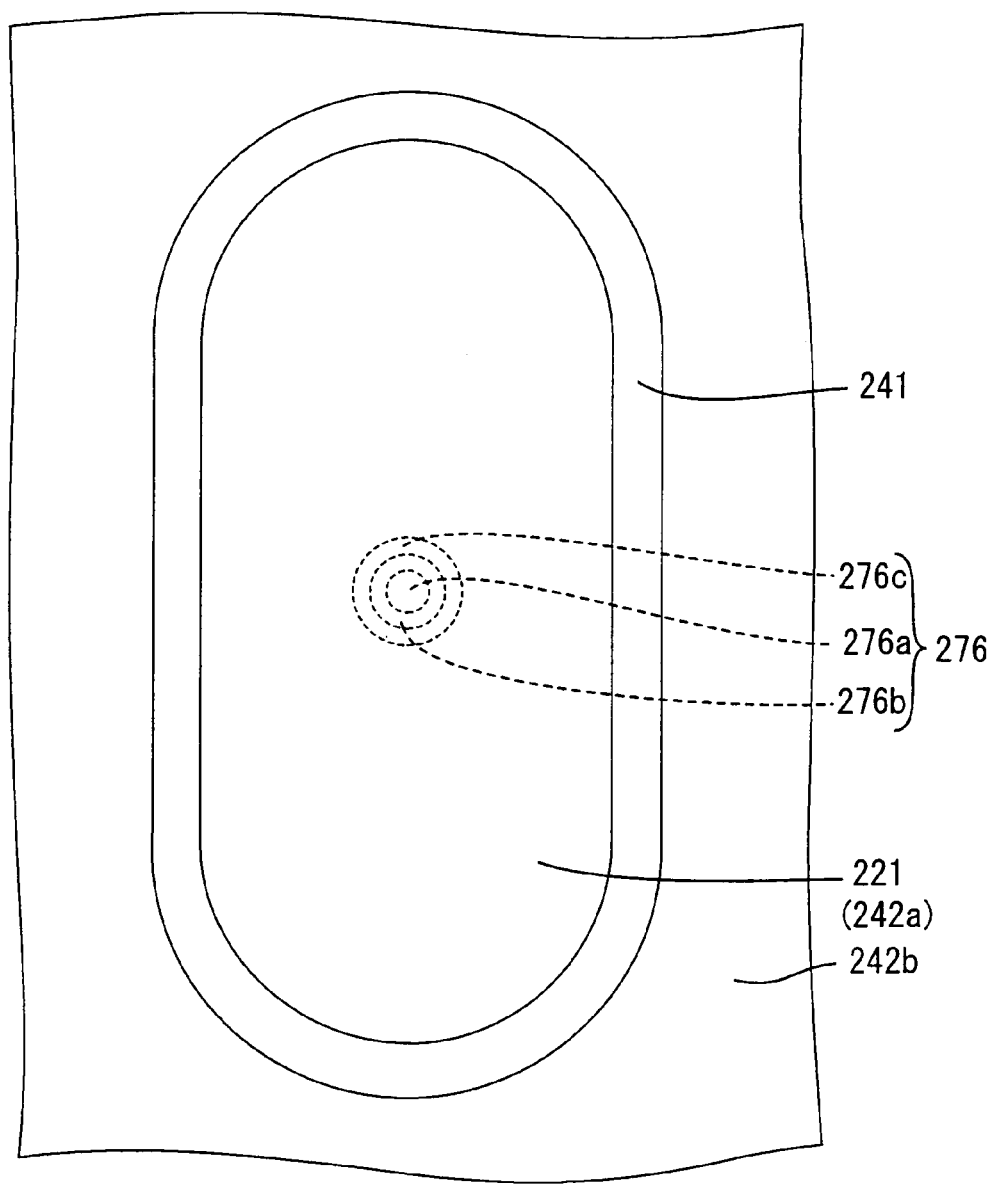
FIG. 24B is a plan view corresponding to FIG. 24A.

In FIG. 24A, a positioning portion 276 comprises: a positioning protrusion 276a of a circular conical shape; a positioning groove 276b having an annular shape concentric with the positioning protrusion 276a and disposed at a periphery of the positioning protrusion 276a; and a positioning protrusion 276c having an annular shape concentric with the positioning protrusion 276a. Each of the protrusions 276a, 276c is outward tapered down to a point, while the annular groove 276b is inward tapered down to a point. The positioning portion 276 as a whole has a shape of the body of revolution having an axis perpendicular to the surface of the jig substrate 241. In the first segment 242a or piezoelectric ceramic sheet 221 is formed a positioning portion 277 comprising a circular conical dent, an annular protrusion and an annular dent respectively conforming to the positioning protrusion 276a, the annular groove 276b and the annular positioning protrusion 276c. According to the ninth embodiment also, the advantages the same as those of the sixth embodiment can be obtained. Further, the arrangement where each of the protrusions 276a, 276c is outward tapered down to a point, while the annular groove 276b is inward tapered down to a point, prevents an occurrence of cracking or the like around the each protrusion and groove 276a-276c when the shrinkage of the first segment 242a of the piezoelectric ceramic sheet 221 takes place.

Although in the ninth embodiment the positioning portion 276 is presented in concentric circles when seen from the upper side, this is not essential. For instance, a planar shape of each of the positioning protrusions 276a, 276c and groove 276b may be a foursquare, a rectangle or an ellipse. Further, corners and edges of each of the upper and bottom portions of the positioning portion 276 may be chamfered.

It is to be understood that the sixth through ninth embodiments of the present invention are not limited to the details as described above, but may be otherwise embodied without departing from the gist of the invention. For instance, embodiments as described below are also included in the technical scope of the invention.

(1) In the above description, the liquid delivery apparatus in the form of an ink jet head is described as an apparatus manufactured according to the sixth through ninth embodiments of the invention. However, the present invention is also applicable to a method of manufacturing a micropump for delivering a liquid, which includes a member made of a piezoelectric ceramic material.

(2) Although only a single positioning portion is provided on the jig substrate at the position corresponding to the center of the piezoelectric ceramic sheet in each of the sixth to ninth embodiments, this is not essential. The positioning portion may be disposed at a position corresponding to other portion of the piezoelectric ceramic sheet than the center thereof, such as a marginal portion. Further, a plurality of positioning portions may be provided for each first segment 242a or piezoelectric ceramic sheet.

(3) According to each of the sixth to ninth embodiments, the diaphragm is made of a metallic material having an electric conduction property. However, the diaphragm may be made of a resin or ceramic material such as a polyimide resin or alumina. In a case where such a resin or ceramic material is employed, it is necessary to separately provide a member which serves as a lower electrode on the upper surface of the diaphragm made of the resin or ceramic material.

Each of the sixth through ninth embodiments and modifications thereof as described above can be implemented in combination with any one of the first through fifth embodiments or a modification thereof as previously described.

Further, although in the embodiments described above the piezoelectric ceramic sheets are bonded to the fluid passage unit with an adhesive, the piezoelectric ceramic sheets and the fluid passage unit may be integrated by other methods, such as welding with a brazing filler metal.

What is claimed is:

1. A method of manufacturing a liquid delivery apparatus which comprises: a plurality of pressure chambers accommodating a liquid; nozzles communicating with the respective pressure chambers; and a plurality of piezoelectric ceramic sheets disposed at respective positions corresponding to the pressure chambers, the apparatus being configured to deliver the liquid to the outside from selected one of the nozzles by deforming the corresponding piezoelectric ceramic sheet to pressurize the liquid in the corresponding pressure chamber, the method comprising steps of:

providing a fluid-passage-unit forming member which forms at least a part of a fluid passage unit;

laminating a green sheet, to be eventually formed into the plurality of piezoelectric ceramic sheets, on a jig substrate;

segmenting the green sheet into a plurality of segments;

firing the plurality of segments of the green sheet, obtained by the segmenting step, into the plurality of piezoelectric ceramic sheets;

fixing at least predetermined ones of the plurality of piezoelectric ceramic sheets acquired by the firing step to the fluid-passage-unit forming member; and removing the jig substrate from the at least predetermined ones of the plurality of the piezoelectric ceramic sheets.

2. The method according to claim 1, wherein the step of laminating the green sheet is implemented such that the at least predetermined ones of the piezoelectric ceramic sheets obtained by firing the plurality of segments of the green sheet, are capable of being separated from the jig substrate.

3. The method according to claim 1, wherein:

the segmenting step is implemented to segment the green sheet disposed on the jig substrate, into first and second segments as the plurality of segments;

the fixing step includes a first substep that is implemented to apply an adhesive onto regions of the fluid-passage-unit forming member that positionally correspond to the respective pressure chambers; and the fixing step includes a second substep that is implemented to bring the first and second segments into contact with the fluid-passage-unit forming member such that the first segments, as the predetermined ones of the plurality of piezoelectric ceramic sheets, are placed in the respective regions of the fluid-passage-unit forming member, so as to fix the first segments to the fluid-passage-unit forming member.

4. The method according to claim 1, wherein:
the segmenting step is implemented to segment the green sheet disposed on the jig substrate, into first and second segments as the plurality of segments;
the fixing step includes a first substep that is implemented to apply an adhesive onto the first segments; and
the fixing step includes a second substep that is implemented to bring the first and second segments into contact with the fluid-passage-unit forming member such that the first segments, as the predetermined ones of the plurality of piezoelectric ceramic sheets, are placed in respective regions of the fluid-passage-unit forming member that positionally correspond to the respective pressure chambers, so as to fix the first segments to the fluid-passage-unit forming member.

5. The method according to claim 1, wherein:
the fluid-passage-unit forming member has a diaphragm which closes the plurality of pressure chambers;
the segmenting step is implemented to segment the green sheet disposed on the jig substrate, into first and second segments as the plurality of segments;
the fixing step includes a first substep that is implemented to apply an adhesive onto regions of the diaphragm that positionally correspond to the respective pressure chambers; and
the fixing step includes a second substep that is implemented to bring the first and second segments into contact with the fluid-passage-unit forming member such that the first segments, as the predetermined ones of the plurality of piezoelectric ceramic sheets, are placed in the respective regions of the diagram, so as to fix the first segments to the fluid-passage-unit forming member.

6. The method according to claim 1, wherein:
the fluid-passage-unit forming member has a diaphragm which closes the plurality of pressure chambers;
the segmenting step is implemented to segment the green sheet disposed on the jig substrate, into first and second segments as the plurality of segments;
the fixing step includes a first substep that is implemented to apply an adhesive onto the first segments; and
the fixing step includes a second substep that is implemented to bring the first and second segments into contact with the fluid-passage-unit forming member such that the first segments, as the predetermined ones of the plurality of piezoelectric ceramic sheets, are placed in respective regions of the diaphragm that positionally correspond to the respective pressure chambers, so as to fix the first segments to the fluid-passage-unit forming member.

7. The method according to claim 1, wherein:
the fluid passage unit is formed of a plurality of mutually superposed plates, each of which is provided by the fluid-passage-unit forming member;
the segmenting step is implemented to segment the green sheet disposed on the jig substrate, into first and second segments as the plurality of segments;
the fixing step includes a first substep that is implemented to apply an adhesive onto regions of one of the mutually superposed plates that positionally correspond to the respective pressure chambers; and
the fixing step includes a second substep that is implemented to bring the first and second segments into contact with the one of the mutually superposed plates such that the first segments, as the predetermined ones of the plurality of piezoelectric ceramic sheets, are placed in the respective regions of the one of the mutually superposed plates, so as to fix the first segments to the one of the mutually superposed plates.

8. The method according to claim 1, wherein:
the fluid passage unit is formed of a plurality of mutually superposed plates, each of which is provided by the fluid-passage-unit forming member;
the segmenting step is implemented to segment the green sheet disposed on the jig substrate, into first and second segments as the plurality of segments;
the fixing step includes a first substep that is implemented to apply an adhesive onto the first segments; and
the fixing step includes a second substep that is implemented to bring the first and second segments into contact with one of the mutually superposed plates, such that the first segments, as the predetermined ones of the plurality of piezoelectric ceramic sheets, are placed in respective regions of the one of the mutually superposed plates that positionally correspond to the respective pressure chambers, so as to fix the first segments to the one of the mutually superposed plates.

9. A method of manufacturing a liquid delivery apparatus which comprises: a plurality of pressure chambers accommodating a liquid; nozzles communicating with the respective pressure chambers; and a plurality of piezoelectric ceramic sheets disposed at respective positions corresponding to the pressure chambers, the apparatus being configured to deliver the liquid to the outside from selected one of the nozzles by deforming the corresponding piezoelectric ceramic sheet to pressurize the liquid in the corresponding pressure chamber, the method comprising steps of:
providing a fluid-passage-unit forming member which forms at least a part of a fluid passage unit;
laminating a green sheet, to be eventually formed into the plurality of piezoelectric ceramic sheets, on a jig substrate;
segmenting the green sheet into a plurality of segments;
firing the plurality of segments of the green sheet, obtained by the segmenting step, into the plurality of piezoelectric ceramic sheets; and
fixing at least predetermined ones of the plurality of piezoelectric ceramic sheets acquired by the firing step to the fluid-passage-unit forming member,
wherein:
the jig substrate has a plurality of positioning portions, at least one of, which is disposed for each of positions corresponding to the plurality of pressure chambers;
the laminating step comprises forming the green sheet on the jig substrate having the plurality of positioning portions; and
the fixing step comprises fixing, to the fluid-passage-unit forming member, the at least predetermined ones of the piezoelectric ceramic sheets that are positioned on the jig substrate by the positioning portions.

10. The method according to claim 9, wherein the fluid-passage-unit forming member has a diaphragm, which closes the plurality of pressure chambers, and the fixing step comprises fixing to the diaphragm, the at least predetermined ones of the piezoelectric ceramic sheets that are positioned on the jig substrate by the positioning portions.

11. The method according to claim 10, wherein the fixing step comprises coating surfaces of the at least predetermined ones of the piezoelectric ceramic sheets obtained by the firing step, with an adhesive, and pressing the diaphragm onto the surfaces of the at least predetermined piezoelectric ceramic sheets coated with the adhesive.

12. The method according to claim 10, wherein the fixing step comprises coating a surface of the diaphragm with an adhesive on at least one portion corresponding to a pattern of disposing the at least predetermined ones of the piezoelectric ceramic sheets, and pressing the diaphragm onto the at least predetermined ones of the piezoelectric ceramic sheets obtained by the firing step.

13. The method according to claim 9, wherein the fixing step comprises fixing the at least predetermined ones of the piezoelectric ceramic sheets that are positioned corresponding to the plurality of pressure chambers to the fluid-passage-unit forming member so as to oppose the plurality of pressure chambers, respectively.

14. The method according to claim 9, wherein the fluid-passage-unit forming member has a diaphragm, which closes the plurality of pressure chambers, and the fixing step comprises fixing the at least predetermined ones of the piezoelectric ceramic sheets acquired by the firing step, to the diaphragm.

15. The method according to claim 14, wherein the fixing step comprises fixing the at least predetermined ones of the piezoelectric ceramic sheets that are positioned corresponding to the plurality of pressure chambers to the diaphragm so as to oppose the plurality of pressure chambers, respectively, and not to spread beyond an area corresponding to a planar area of the corresponding pressure chamber.

16. The method according to claim 14, wherein the fixing step comprises a substep of coating a surface of the diaphragm with an adhesive.

17. The method according to claim 9, wherein the fixing step comprises a substep of coating with an adhesive surface of the at least predetermined ones of the piezoelectric ceramic sheets.

18. The method according to claim 17, wherein the adhesive is an electrically conductive adhesive.

19. The method according to claim 9, further comprising a step of separating, after the fixing step, the at least predetermined ones of the piezoelectric ceramic sheets from the jig substrate.

20. The method according to claim 9, wherein the segmenting step comprises segmenting the green sheet with a laser beam.

21. The method according to claim 9, wherein the segmenting step comprises segmenting the green sheet by pressing a mold onto the green sheet.

22. The method according to claim 9, wherein each of the plurality of positioning portions is disposed at a position corresponding to a center of a corresponding one of the at least predetermined piezoelectric ceramic sheets, or to a center of gravity of the corresponding piezoelectric ceramic sheet.

23. The method according to claim 9, wherein each of the plurality of positioning portions comprises at least one of a protrusion projecting from the jig substrate and a dent formed in the jig substrate.

24. The method according to claim 23, wherein a circumferential surface of the at least one of the protrusion and the dent is tapered down to a point.

25. The method according to claim 23, wherein an end portion of the protrusion, or a bottom portion of the dent is chamfered.

26. The method according to claim 9, wherein each of the plurality of positioning portions has a shape of a body of revolution having an axis perpendicular to a surface of the jig substrate.

27. The method according to claim 9, wherein the step of providing the fluid-passage-unit forming member comprises forming the fluid-passage-unit forming member having the plurality of pressure chambers and the nozzles, and the fixing step comprises fixing the at least predetermined ones of the plurality of piezoelectric ceramic sheets to the fluid-passage-unit forming member.

* * * * *